United States Patent
Mangrum

(10) Patent No.: US 10,566,680 B2
(45) Date of Patent: Feb. 18, 2020

(54) PACKAGED ELECTRONIC DEVICE HAVING INTEGRATED ANTENNA AND LOCKING STRUCTURE

(71) Applicant: Amkor Technology, Inc., Tempe, AZ (US)

(72) Inventor: Marc Alan Mangrum, Manchaca, TX (US)

(73) Assignee: Amkor Technology, Inc., Tempe, AZ (US)

( * ) Notice: Subject to any disclaimer, the term of this patent is extended or adjusted under 35 U.S.C. 154(b) by 159 days.

(21) Appl. No.: 15/911,082

(22) Filed: Mar. 3, 2018

(65) Prior Publication Data

US 2018/0191055 A1   Jul. 5, 2018

Related U.S. Application Data

(63) Continuation of application No. 14/931,750, filed on Nov. 3, 2015, now Pat. No. 9,966,652.

(51) Int. Cl.
*H01Q 1/22* (2006.01)
*H01Q 9/04* (2006.01)

(52) U.S. Cl.
CPC ......... *H01Q 1/2283* (2013.01); *H01Q 9/0407* (2013.01); *H01L 2223/6677* (2013.01); *H01L 2224/05554* (2013.01); *H01L 2224/32245* (2013.01); *H01L 2224/48137* (2013.01); *H01L 2224/48247* (2013.01); *H01L 2224/48257* (2013.01); *H01L 2224/49171* (2013.01); *H01L 2224/73265* (2013.01); *H01L 2924/181* (2013.01); *H01L 2924/19107* (2013.01)

(58) Field of Classification Search
CPC ................ H01Q 1/2283; H01Q 9/0421; H01L 2223/6677
See application file for complete search history.

(56) References Cited

U.S. PATENT DOCUMENTS

| | | | |
|---|---|---|---|
| 6,713,322 B2 | 3/2004 | Lee | |
| 6,975,029 B2 | 12/2005 | Horie | |
| 7,518,221 B2 | 4/2009 | Gaucher et al. | |
| 8,102,037 B2 | 1/2012 | Lee | |
| 2006/0276157 A1 | 12/2006 | Chen et al. | |
| 2007/0164907 A1 | 7/2007 | Gaucher et al. | |

FOREIGN PATENT DOCUMENTS

| | | |
|---|---|---|
| KR | 1019940006742 | 4/1998 |
| KR | 1019980063125 | 11/2001 |

*Primary Examiner* — Robert Karacsony
(74) *Attorney, Agent, or Firm* — Kevin B. Jackson

(57) ABSTRACT

A packaged electronic device includes an integrated antenna as part of a conductive leadframe. The conductive leadframe includes a die paddle have an elongated conductive beam structure configured as a transmission line, and a ground plane structure disposed surrounding the die paddle. The ground plane includes a gap where the transmission line extends to an edge of the packaged electronic device. In one embodiment, selected leads within the leadframe are configured with conductive connective structures as ground pins, source pins, and/or wave guides. In an alternate embodiment, a portion of the integrated antenna is embedded and partially exposed within the body of the packaged electronic device.

20 Claims, 21 Drawing Sheets

310

320

380

390

400

PACKAGED ELECTRONIC DEVICE HAVING INTEGRATED ANTENNA AND LOCKING STRUCTURE

CROSS-REFERENCE TO RELATED APPLICATIONS

The present application is a continuation application of co-pending U.S. patent application Ser. No. 14/931,750 filed on Nov. 3, 2015 entitled PACKAGED ELECTRONIC DEVICE HAVING INTEGRATED ANTENNA AND LOCKING STRUCTURE, which is expressly incorporated by reference herein, and priority thereto is hereby claimed.

BACKGROUND

The present invention relates, in general, to electronics and, more particularly, to packaged electronic structures and methods of forming electronic structures.

Wireless and portable handheld communication applications markets are examples of markets continuing to grow and evolve with an increased effort to integrate more electronic functionality into smaller, lighter, thinner, and lower cost solutions. One of the continuing challenges for these applications is the improvement and integration of effective antennas into the various product platforms. Several approaches have been developed and implemented in numerous form factors, but typically utilize more traditional antenna designs, such as discrete foil strips and separate retractable dipole antennas as well as combinations thereof located within or exterior to the product. Such antennas include slot antennas, inverted F antennas ("IFA"), planar inverted F antennas ("PIFA"), and various configurations of micro-strip antennas, also known as "patch" antennas.

The antennas used in wireless applications have been incorporated into product housings as separate and discrete components using materials, such as conductive strip tapes, placed into product cases using carbon based materials to form the appropriate antenna array, or included as a separate and discrete component electrically connected to the RF section of the device. Other approaches have placed the antenna as a separate component on system printed circuit boards ("PCBs") utilizing features of the PCB and other antenna elements within the applications to complete the antenna functionality.

Each of these previous approaches adds cost to the device. Also, these previous approaches are difficult to design, consume power due to inefficient operation, add bulk to the application, and limit the absolute size and/or form factor of the application. Additionally, each solution or technique is unique to the device it is designed for, which minimizes design reuse and increases the complexity of the device design cycle, further adding to the cost and increasing the time to market for product introduction.

Another continuing challenge for electronic packaged devices is the delamination of molding compound ("EMC") in substrate-based packaged electronic devices, such as lead frame packaged electronic devices. Delamination is often encountered during reliability stress testing and limits the use of these packaging types in certain applications and markets. Delamination beyond acceptable industry standard limits, such as those defined in JEDEC standards, is typically defined as a reliability risk and results in the device failing reliability qualification. In the past, typical corrective actions have been to change the device bill of materials and/or a redesign of the package level components such as the substrate.

The automotive industry has proposed to redefine the acceptable limits for package level delamination to be essentially zero. This desired goal is actively being pursued throughout the integrated circuit packaging and assembly industry. Current solutions being pursued and proposed have focused primarily on changes to molding compound configurations and die attach materials. Also, a significant amount of development has been applied to treatment of the substrate surfaces in the form of roughening techniques both of which can be chemically and mechanically applied. Typically in this approach, a roughening process has been applied to the surface of a substrate and has been combined with the selecting improved molding compounds and die attach materials. This approach has been shown to provide some improvement in the adhesion between the molding compound and the substrate, thereby reducing delamination. Another approach has been to include protrusions or half-etched portions within the substrate and/or leads, which acts to increase the surface area for adhering to the molding compound. These features also have been used to provide lead stabilization.

However, for larger body devices, (e.g., devices with large die pads greater than 4 millimeters (mm) by 4 mm), devices with long tie bar configurations (e.g., tie bar having lengths greater than about 3 mm), or devices with a high usage of die-to-die attach pad wire bonds, commonly known as down bonds, and combinations thereof, the present solutions have not provided satisfactory results.

Accordingly, structures and methods are needed that provide improved antenna designs to support, among other things, the industry demands for increased electronic functionality within smaller, lighter, thinner, and lower cost solutions. Also it would be beneficial for such structures and methods to be cost effective by using, for example, existing assembly processes and techniques. Additionally, structures and methods are needed for reducing delamination in electronic packages including, for example, the package structures disclosed hereinafter. Further, it would be beneficial for such structures and methods to reduce stresses within the package structures to further improve reliability.

Figure 1:
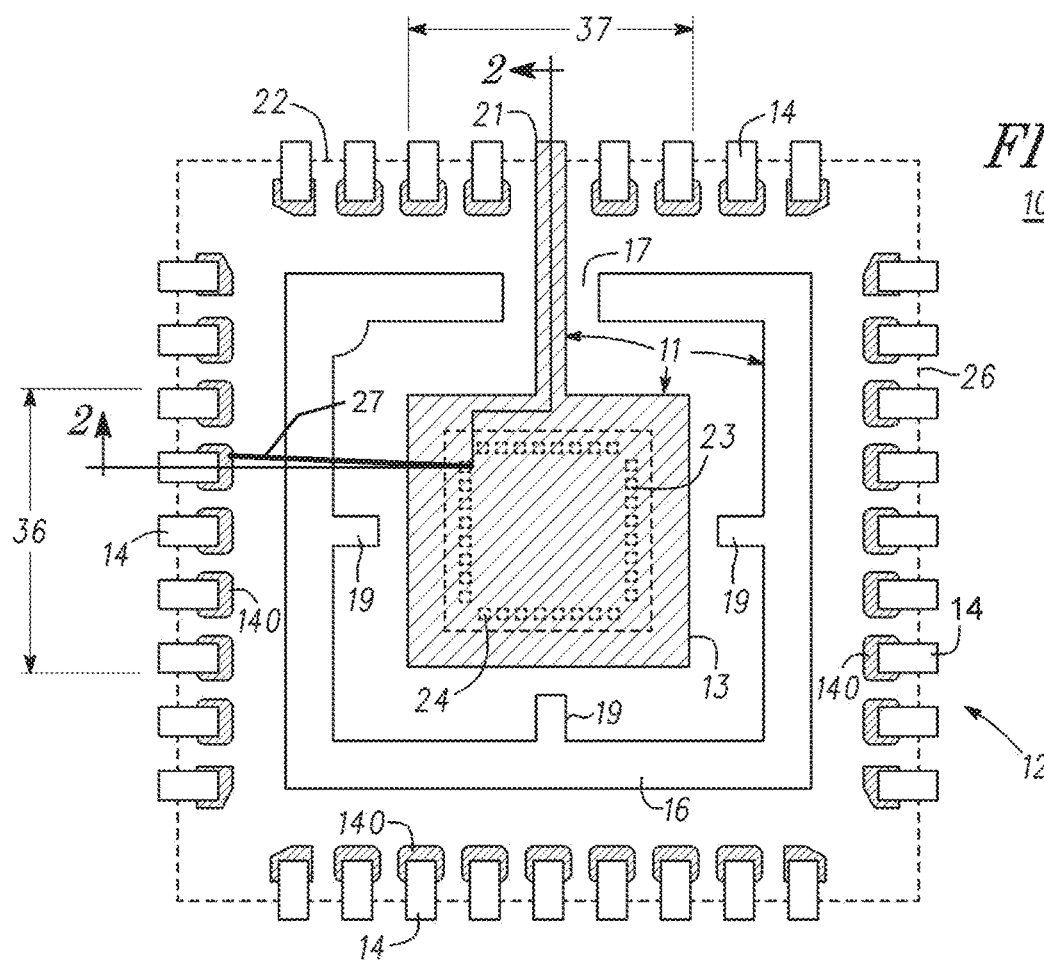
FIG. 1 illustrates a top view of an electronic device having an integrated antenna in accordance with an embodiment of the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the words about, approximately or substantially means that a value of an element has a parameter that is expected to be close to a stated value or position. However, as is well known in the art there are always minor variances that prevent the values or positions from being exactly as stated. It The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Additionally, it is to be understood that where it is stated herein that one layer or region is formed on or disposed on a second layer or another region, the first layer may be formed or disposed directly on the second layer or there may be intervening layers between the first layer and the second layer. Further, as used herein, the term formed on is used with the same meaning as located on or disposed on and is not meant to be limiting regarding any particular fabrication process. Moreover, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

DETAILED DESCRIPTION OF THE DRAWINGS

In some applications, electronic devices, such as semiconductor die, are enclosed in plastic packages that provide protection from hostile environments and enable electrical interconnection between the semiconductor die and a next level of assembly, such as a printed circuit board (PCB) or motherboard. The elements of such a package typically include a conductive substrate, such as a metal leadframe, an integrated circuit or semiconductor die, bonding material to attach the semiconductor die to the leadframe, interconnect structures electrically connecting pads on the semiconductor die to individual leads of the leadframe, and a hard plastic encapsulant material covering the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, which is completely surrounded by the plastic encapsulant or package body. Other portions of the leads of the leadframe may extend externally from the package body or may be partially exposed therein for use in electrically connecting the package to another component.

The present description is directed to electronic package structures having integrated antenna structures together with, in some embodiments, electronic components, such as semiconductor components and/or passive components. Examples of semiconductor packages relevant to the present invention include, but are not limited to, MicroLeadFrame® type packages ("MLF") including dual-row MLF type packages ("DR-MLF"), quad flat no-lead packages ("QFN"), small-outline no-lead packages ("SON"), dual flat no-lead packages ("DFN"), quad flat packages ("QFP"), thin substrate chip scale packages ("tsCSP"), advanced QFN packages ("aQFN"), and grid array packages ("GQFN"). Packages such as the foregoing are relevant because they include conductive substrates, such as leadframes having a die attach structure or pad, which can either be exposed to the outside or encapsulated, and they include material properties that support the incorporation of antenna designs in accordance with embodiments of the present invention. For example, these packages include conductive materials, such as copper, nickel, gold, silver, palladium, iron, among others in the construction of incorporated leadframes, and these packages include insulative materials such as epoxy mold compounds.

In general, the present embodiments relate to a packaged electronic device having an integrated antenna including a substrate comprising a first conductive die attach pad, and a first conductive lead spaced apart from a first side of the first conductive die attach pad. An electronic device is electrically connected to the first conductive lead and a package body encapsulates the electronic device and further encapsulates at least portions of the first conductive die attach pad, and at least portions of the first lead. In several embodiments, the integrated antenna includes an antenna structure comprising one or more of the first conductive die attach pad and a second conductive lead; and an elongated conductive beam structure disposed proximate to the first side of the first conductive die attach pad, the elongated conductive beam structure electrically coupled to one or more of first conductive die attach pad and the electronic device, wherein the package body encapsulates at least portions of the elongated conductive beam structure. In one embodiment, the elongated conductive beam structure is configured to have a length greater than the conductive leads. In one embodiment, the elongated conductive beam structure has a length that is least 4× the length of the conductive leads.

In another embodiment, a packaged electronic device structure having an integrated antenna comprises a first die pad with a first major surface and a second major surface opposite to the first major surface. A plurality of conductive leads (i.e., more than one lead) is disposed spaced apart from peripheral edge segments of the die pad. An electronic device is electrically connected to the plurality of conductive leads. A package body encapsulates the electronic device, at least portions of the conductive leads, and at least portions of the first die pad. An antenna structure is at least partially embedded within the package body, wherein the antenna structure comprises a conductive structure configured to resonate responsive to an electrical signal. In accordance with the present disclosure, non-limiting examples of conductive structures configured to resonate responsive to an electrical signal comprise uniquely configured die attach pads, elongated conductive beam structures, spiral antenna structures, slot structures within conductive pads or elongated conductive beam structures, conductive loop structures, wave guides, conductive pillar structures, and combinations thereof.

In a further embodiment, A packaged electronic device structure having an integrated antenna includes a conductive leadframe comprising a die pad with a first major surface and a second major surface opposite to the first major surface and a plurality of conductive leads disposed spaced apart from peripheral edge segments of the die pad, and a tie bar attached to the die pad. An electronic device is electrically connected to the plurality of conductive leads and a molded package body encapsulates the electronic device, at least portions of each conductive lead, and at least portions of the die pad. An antenna structure is at least partially encapsulated within the molded package body, wherein the antenna structure comprises a conductive structure configured to resonate responsive to an electrical signal, the conductive structure comprising the die pad and one or more of a slot disposed within the die pad, a separate conductive pad having an aperture disposed between major surfaces of the separate conductive pad, a conductive pillar structure, an elongated conductive structure, and an elongated conductive beam structure having a slot.

Additionally, several types of antenna designs may be configured within a packaged substrate design in accordance with the present embodiments. These include, but are not limited to, the following: variations of loop antennas, broadband dipoles, monopole antennas, folded dipole antennas, microstrip or patch antennas, planar inverted F antennas ("PIFA"), inverted F antennas ("IFA"), Vivaldi antennas, slotted wave guide antennas, half-wave and quarter wave antennas. These designs may be configured to take advantage of appropriately configured and oriented die attach pads, lead fingers, tie bars and additional conductive elements to form antennas configured for applications including, but not limited to, wireless—hand held devices that require an RF signal be transmitted and/or received, such as, but not limited to, smart phones, two-way communication devices, PC tablets, RF tags, sensors, Bluetooth®, and Wi-Fi devices, Internet-of-Things ("IoT"), home security, remote control devices, among others. Several of the designs will be described hereinafter, but one of ordinary skill in the art will appreciate that the present invention is relevant to any antenna design supported by the elements and features described herein. Further, those of ordinary skill in the art will appreciate that although the following description focuses on various leadless leadframe based embodiments, the same principles of implementation may be applied to leaded leadframe packages.

Although the present description tends to use leadframe type substrates, it is understood that the present disclosure is applicable as well to other types of substrates, including, but not limited to laminate substrates and other substrates as known to those of ordinary skill in the art. Additionally, reference is made throughout the present description to an electronic component 23, electronic device 23, or electronic chip 23, which can be a semiconductor integrated circuit ("IC"), such as a mixed signal IC, a microcontroller, a power semiconductor device, such as an RF power transistor, other types of logic and/or analog devices or integrated functionality, integrated passive capability, application specific ICs ("ASICs"), and other types of similar semiconductor devices as known to those of ordinary skill the art. Electronic component 23 can provide control, monitoring, filtering, amplification, powering and other functionality to the integrated antennas described hereinafter, or electronic component 23 can be isolated and/or independent from functions required to control, monitor, power, or otherwise interact or electrically communicate with the integrated antenna. However, in some embodiments, it is preferable for electronic component 23 to electrically communicate with the integrated antenna device to provide space efficient packaged devices in accordance with the present disclosure.

FIG. 1 illustrates a top view of a packaged electronic device 10 or electronic device 10 having an integrated antenna 11 in accordance with a first embodiment. In the present embodiment, integrated antenna 11 is configured as a microstrip or patch antenna embodiment in a QFN or MLF type package. Electronic device 10 includes a substrate 12 or a conductive substrate 12, such as a conductive leadframe 12 or leadframe 12. In one embodiment, leadframe 12 includes a generally quadrangular (e.g., square) die paddle 13 or die pad 13 defining four peripheral edge segments and a plurality of first conductive leads 14 or leads 14, which can be segregated into four (4) sets, with each set of leads 14 disposed spaced apart from die pad 13 and extending generally perpendicularly from a corresponding one of the peripheral segments of die pad 13. It is understood that leadframe 12 may include more or fewer leads than illustrated in the present embodiment.

In accordance with the present embodiment, leadframe 12 further includes a ground plane structure 16, which in the present embodiment has a frame-like structure or a ring-like structure substantially surrounding die pad 13 and disposed between die pad 13 and leads 14. In one embodiment, ground plane structure 16 includes a gap 17 or space 17 disposed in or within one side of ground plane structure 16. In one embodiment, ground plane structure 16 may include one or more conductive fingers 19 extending generally perpendicularly from side surfaces of ground plane structure 16 towards die pad 13. As will be explained later, conductive fingers 19 can be disposed in one or more predetermined locations with respect to die pad 13 to provide different antenna configurations in accordance with the present embodiments. In some embodiments, ground plane structure 16 can be connected to leadframe 12 as part of a tie bar configuration (not shown), and such connection to the tie bar configuration can be separated after molded package body 26 is formed.

In accordance with the present embodiment, an elongated conductive beam structure 21, elongated conductive body 21, or conductive transmission line 21 is disposed connected to one of the peripheral edge segments of die pad 13 and extends generally perpendicularly from the peripheral edge segment towards an outer edge 22 of electronic device 10. In one preferred embodiment, elongated conductive beam structure 21 is disposed extending from a center line of die pad 13 and extends through gap 17 of ground plane structure 16 to outer edge 22. In one embodiment, die pad 13 and elongated conductive beam structure 21 are of a different thickness than leads 14 and ground plane structure 16. More particularly, die pad 13 and elongated conductive beam structure 21 can be partially etched from their respective lower surfaces such that the lower surfaces are on a different plane than the lower surfaces of leads 14 and ground plane structure 16. This is indicated in FIG. 1 by the condensed hatching that slopes downwardly from right to left. In some embodiments, portions 140 of leads 14 are also partially etched to provide a locking mechanism or structure with package body 26. It is understood that in other embodiments ground plane structure 16 can also be partially etched to provide locking mechanisms or structures.

Electronic device 10 further includes one or more electronic components 23, such as a semiconductor device 23 disposed on one surface of die pad 13. In FIG. 1, electronic component 23 is illustrated as a dashed line so as to not obstruct the cross-hatching used to illustrate the partial etching of die pad 13. In several embodiments, electronic component 23 includes bond pads 24 overlying one surface of electronic component 23 for electrically connecting electronic component 23 to leads 14, die pad 13, and/or ground plane structure 16. By way of example, bond pads 24 are electrically connected to leads 14 using conductive structures 27, such as wire bonds 27, conductive clips, or other conductive structures as known to those of ordinary skill in the art.

Electronic device 10 further includes an encapsulant material applied to the electronic component, the conductive structures, portions of leads 14, portions of ground plane structure 16, die pad 13 and elongated conductive beam structure 21 to form package body 26. In the present embodiment, lower and outer end surfaces of leads 14 are exposed in package body 26; lower surfaces of ground plane structure 16 are exposed in the lower surface of package 26; and an end portion of elongated conductive beam structure 21 is exposed in a side surface of package body 26. In some embodiments, package body 26 comprises an insulating material, such as an epoxy mold compound ("EMC"), or other materials as known to those of ordinary skill in the art. In some embodiments, package body 26 is formed using over-molding techniques. In other embodiments, injection molding techniques are used to form package body 26.

In accordance with the present embodiment, integrated antenna 11 comprises elongated conductive beam structure 21, ground plane structure 16, and die pad 13. More particularly, in one embodiment integrated antenna 11 is configured as quarter wave ($\lambda/4$) type antenna structure contained within package body 26 together with leads 14 and electronic component 23. In one embodiment, leadframe 12 can be etched or stamped to provide the elements of electronic device 10 having integrated antenna 11. In accordance with the present invention, the etching process used to form leadframe 12 conveniently provides or enables enhanced flexibility for the design of leadframe 12 and antenna design integration. Additionally, it is understood that a combination of etching and stamping techniques can be used in embodiments where the die pad is configured to be non-exposed through one or more surfaces of package body 26.

Figure 2:
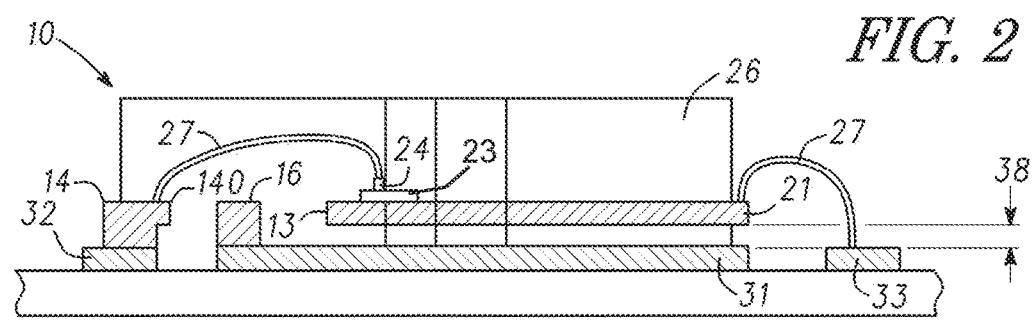
FIG. 2 is a cross-sectional view the electronic device of FIG. 1 taken along reference line 2-2 in FIG. 11 further in combination with a next level of assembly in accordance with an embodiment of the present invention.

FIG. 2 is a cross-sectional view of electronic device 10 with integrated antenna 11 taken along reference line 2-2 in FIG. 1. FIG. 2 further illustrates an example of a conductive structure, such as wire bond 27 electrically connecting bond pad 24 overlying a surface of electronic component 23 to a lead 14. FIG. 2 also illustrates electronic device 10 further in combination with a next level of assembly, such as a printed circuit board 20. In one embodiment, printed circuit board 20 includes a plurality of conductive traces, such a conductive ground plane 31 and contacts 32 and 33.

Figure 3:
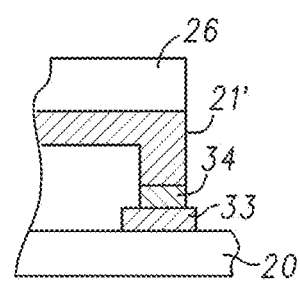
FIG. 3 illustrates a partial cross-sectional view of a portion of the electronic device of FIG. 2 in accordance with alternative embodiment of the present invention.

In one embodiment, conductive ground plane 31 is electrically connected to ground plane structure 16 to supplement the ground plane structure for antenna structure 11. In one embodiment, elongated conductive beam structure 21 can be electrically connected to contact 33 using a conductive connective structure, such as a wire bond 27. In alternative embodiment, elongated conductive beam structure 21' can be configured to have a full-thickness distal end portion that can directly attached to contact 33 using, for example, a solder layer 34 or a conductive adhesive layer 34 as illustrated in FIG. 3.

As shown in the illustration of FIG. 2, die pad 13 is not soldered or electrically connected to printed circuit board 20, but is instead separated from it by package body 26. Advantageously, in the present embodiment ground plane structure 16 provided as a ring-like structure helps to secure electronic device 10 to printed circuit board 20 and further improves the effectiveness of integrated antenna 11 by extending the ground plane along the side surfaces of die pad 13.

In accordance with the present embodiment, integrated antenna 11 is configured as a patch or microstrip antenna where die pad 13 provides the patch antenna portion and elongated conductive beam structure 21 provides the transmission line that feeds or sources the patch antenna portion. Accordingly, die pad 13 has a length 36 and width 37 and is encased (at least in part) within a dielectric material (i.e., package body 26) having a thickness 38 and a selected permittivity. In the present embodiment, the dielectric material for package body 26 may be selected to provide a permittivity that optimizes impedance for a selected design. In one preferred embodiment, die pad 13, ground plane structure 16, and elongated conductive beam structure 21 comprise a high conductivity metal, such as a copper, a copper alloy, or similar materials.

In one embodiment, integrated antenna 11 has a length 36 equal to one-half of a wavelength as determined within the dielectric medium selected for package body 26. In one embodiment, the frequency of operation of integrated antenna 11 is determined by length 36 as a function of width 37. More particularly, width 37 is one factor that determines the input impedance of integrate antenna 11. For example, by increasing width 37, the impedance of integrated antenna 11 may be reduced. In other embodiments, a length 36 less than width 37 tends to increase the bandwidth of integrated antenna 11 depending on the interactive effects of the permittivity of the dielectric material or insulating material used for package body 26. By way of example, a square die pad 13 will have an input impedance of approximately 300 Ohms.

In one embodiment for applications, such as standard wireless-handheld applications, mobile phone transceiver applications, Bluetooth® applications, RF tag applications, or other wireless or wireless-like applications, leadframe 12 can have a thickness of about 200 microns (about 8 mils). It was found that in these types of applications, this thickness is about 0.05 of a wavelength, which provides acceptable operation for integrated antenna 11. It was further observed that the present embodiment of integrated antenna 11 has a directivity of approximately 5-7 dB and the electrical fields are appropriately linearly polarized and in the horizontal direction with width 37 of die pad 13 equal to its length 36 equal to $0.5\lambda$.

In accordance with the present embodiment, it was further observed that the bandwidth of integrated antenna 11 is typically small, with a magnitude of approximately 3% being typical. By way of example, a typical design of integrated antenna 11 configured to operate at 100 MHz will resonate at approximately 96 MHz. It is believed this loss is a result of fringe fields around the structure of integrated antenna 11, which is one reason integrated antenna 11 resonates.

The design of integrated antenna 11, as well as other patch antenna designs described hereinafter, typically behaves like an open circuit transmission line and as such, the voltage reflection coefficient can be assumed to be about −1. As a result, the voltage associated with the antenna source will be out of phase with the current path in the antenna circuit. Therefore, at the furthest end of die pad 13 (i.e., end further away from elongated conductive beam structure 21) the voltage is at a maximum. At the opposing end of die pad 13 (approximately $\lambda/2$), the voltage is minimal.

Figure 4:
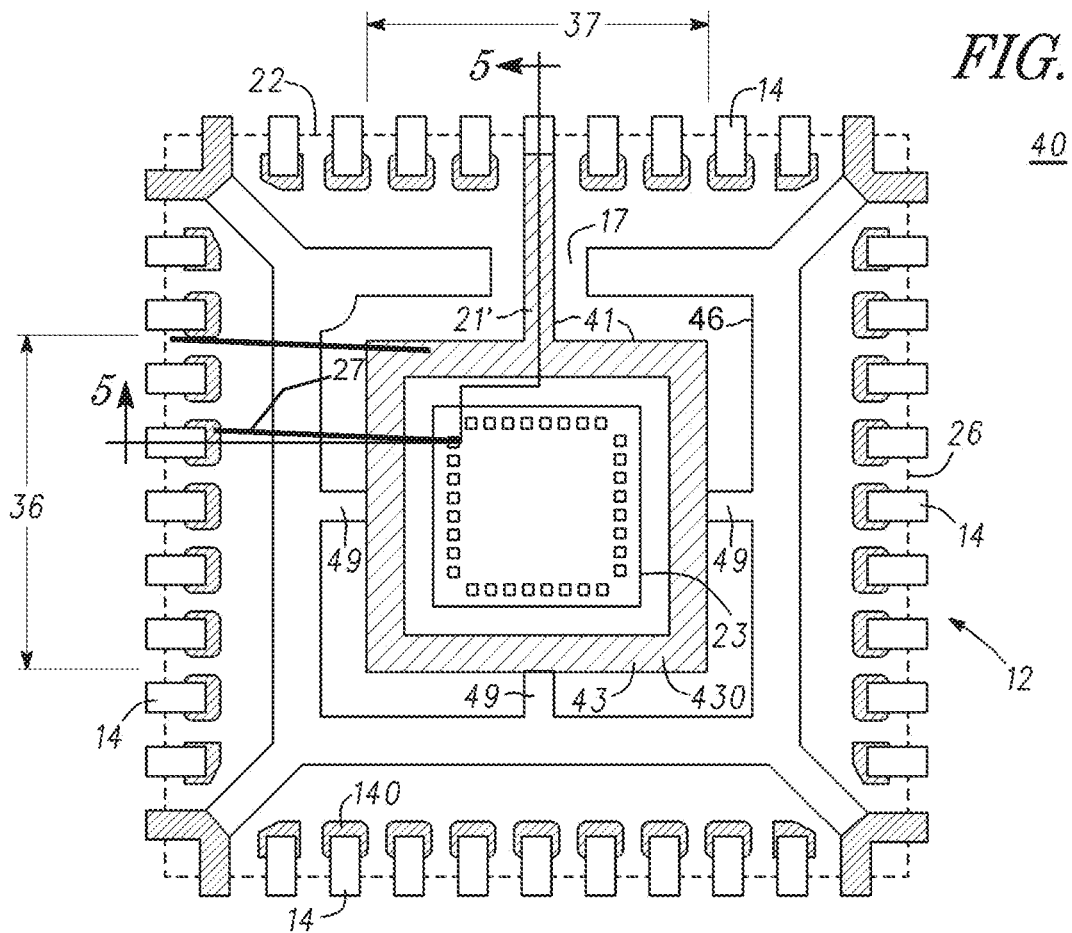
FIG. 4 illustrates a top view of an electronic device having an integrated antenna in accordance with another embodiment of the present invention.

FIG. 4 illustrates a top view of a packaged electronic device 40 or electronic device 40 having an integrated antenna 41 in accordance with a second embodiment. In the present embodiment, integrated antenna 41 is another embodiment of a microstrip or a patch antenna. Electronic device 40 is similar to electronic device 10 and integrated antenna 41 is similar to integrated antenna 11 and only the differences in the structures will be described hereinafter. In the present embodiment, electronic device 40 includes a die paddle 43 or die pad 43 having an edge portion 430 that is reduced in thickness. In one embodiment, edge portion 430 extends along each peripheral edge segment of die pad 43. Additionally, electronic device 40 includes elongated conductive beam structure 21', elongated conductive body 21', or conductive transmission line 21' disposed connected to one of the peripheral edge segments of die pad 43 and extends generally perpendicularly from the peripheral edge segment towards an outer edge 22 of electronic device 40. Further, in electronic device 40 ground plane structure 46 is configured as a part of a tie bar structure that functions initially to support die pad 43 with portions 49 during assembly, and then is used as a ground plane after portions 49 are physically separated from die pad 43, for example, after package body 26 is formed. Additionally, remaining parts of portions 49 can be used as conductive fingers 19 (as illustrated in FIG. 1) as part of antenna structure 41.

Figure 5:
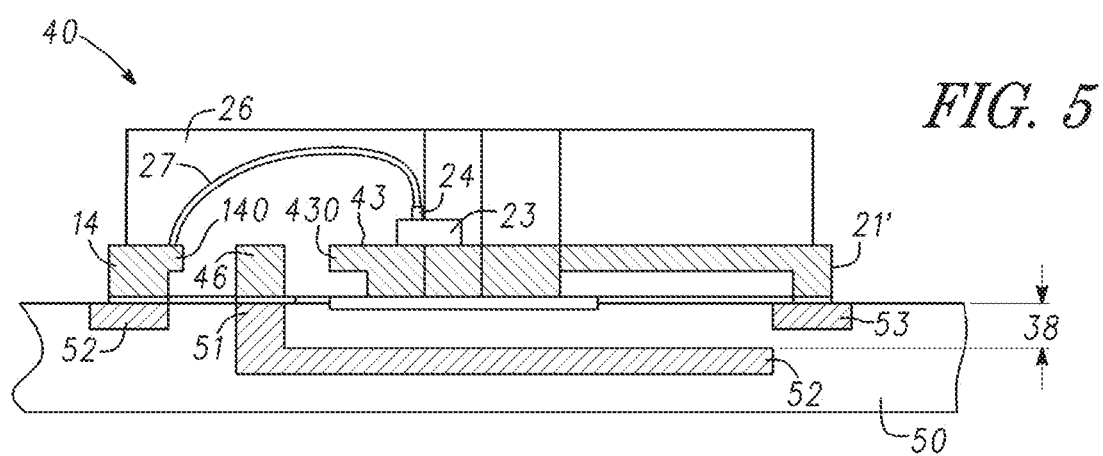
FIG. 5 is a cross-sectional view the electronic device of FIG. 4 taken along reference line 5-5 further in combination with a next level of assembly in accordance with an embodiment of the present invention.

FIG. 5 is a cross-sectional view of electronic device 40 taken along reference line 5-5 of FIG. 4 further in combination with a printed circuit board 50. In the present embodiment, printed circuit board 50 comprises an insulated ground plane structure 56 embedded within it, which is electrically connected to ground plane structure 46 through contact 51. As illustrated in FIG. 5, a portion of the lower surface of die pad 43 is exposed through the lower surface of package body 26 and can be attached to printed circuit board 50 using, for example, an insulated adhesive or other material as known to those of ordinary skill in the art. Elongated conductive beam structure 21' is electrically connected to contact 53 using, for example, a conductive adhesive or other material as known to those of ordinary skill in the art. Also, lead 14 can be electrically connected to contact 52 in a similar manner. In an alternative embodiment, die pad 43 can be grounded to another contact pad placed adjoining it on printed circuit board 50 for applications, for example, that require a grounded patch and/or for improved heat transfer.

Figure 6:
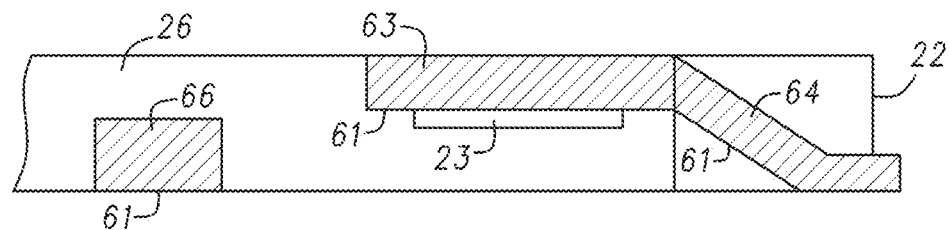
FIG. 6 illustrates a partial cross-sectional view of an electronic device having an integrated antenna in accordance with a further embodiment of the present invention.

FIG. 6 illustrates a partial cross-sectional view of a packaged electronic device 60 or electronic device 60 having an integrated antenna 61 in accordance with a further embodiment. Electronic device 60 is similar to electronic devices 10 and 40 and only the differences will be described herein. In the present embodiment, electronic device 60 includes a die paddle 63 or a die pad 63 and an elongated conductive beam structure 64, elongated conductive body 64, or conductive transmission line 64 disposed connected to one of the peripheral edge segments of die pad 63. In one embodiment, elongated conductive beam structure 64 extends generally perpendicularly from the peripheral edge segment of die pad 63 towards an outer edge 22 of electronic device 60. In accordance with the present embodiment, elongated conductive beam structure 64 is provided in a down-set configuration so that elongated conductive beam structure 64 is exposed through the same surface of package body 26 as ground plane structure 66. Also, die pad 63 is exposed through an opposite surface of package body 26 as an example of a top-exposed pad ("TEP") configuration. In the present embodiment, integrated antenna 61 can be configured as a microstrip or a patch antenna, and includes die pad 63, elongated conductive beam structure 64, and ground plane structure 66.

Figure 7:
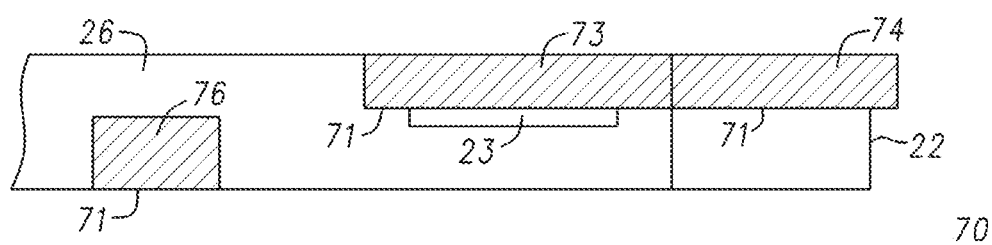
FIG. 7 illustrates a partial cross-sectional view of an electronic device having an integrated antenna in accordance with another embodiment of the present invention.

FIG. 7 illustrates a partial cross-sectional view of a packaged electronic device 70 or electronic device 70 having an integrated antenna 71 in accordance with another embodiment. Electronic device 70 is similar to electronic device 60 and only the differences will be described herein. In the present embodiment, electronic device 70 includes a die paddle 73 or a die pad 73 and an elongated conductive beam structure 74, elongated conductive body 74, or conductive transmission line 74 disposed connected to one of the peripheral edge segments of die pad 73. In one embodiment, elongated conductive beam structure 74 extends generally perpendicularly from the peripheral edge segment of die pad 73 towards an outer edge 22 of electronic device 70. In accordance with the present embodiment, die pad 73 and elongated conductive beam structure 74 are exposed through the same surface of package body 26. Also, ground plane structure 76 is exposed through an opposite surface of package body 26. Electronic device 70 is another example of a top-exposed pad configuration. In the present embodiment, integrated antenna 71 can be configured a microstrip or a patch antenna, and includes die pad 73, elongated conductive beam structure 74, and ground plane layer 76.

Figure 8:
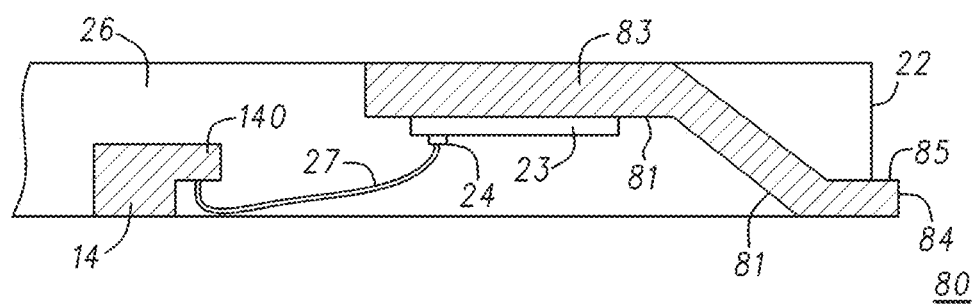
FIG. 8 illustrates a partial cross-sectional view of an electronic device having an integrated antenna in accordance with a further embodiment of the present invention.

FIG. 8 illustrates a partial cross-sectional view of a packaged electronic device 80 or electronic device 80 having an integrated antenna 81 in accordance with a further embodiment. Electronic device 80 is similar to electronic device 60 and only the differences will be described herein. In the present embodiment, electronic device 80 includes a die paddle 83 or a die pad 83 and a tie bar 85 that is attached to die pad 83. In one embodiment, tie bar 85 is provided in a down-set configuration and is exposed in the same surface of package body 26 as lead 14. Die pad 83 is exposed through an opposite surface of package body 26. Electronic component 23 is attached to die pad 83 on a side opposite to the side of die pad 83 exposed through package body 26. In the present embodiment, tie bar 85 is not severed from die pad 83 and in electronic device 80 is further configured as an elongated conductive beam structure 84, elongated conductive body 84, conductive pillar structure 84, or conductive transmission line 84 disposed connected to one of the peripheral edge segments of die pad 83 and extends towards an outer edge 22 of electronic device 80. In accordance with the present embodiment, die pad 83 and elongated conductive beam structure 84 are exposed through opposite surfaces of package body 26. In one embodiment, elongated conductive beam structure 84 extends from a corner of die pad 83. Electronic device 80 is a further example of a top-exposed pad configuration. In the present embodiment, integrated antenna 81 can be configured a microstrip or patch antenna with a separate ground plane provided, for example, external to electronic device 80 in a printed circuit board combination, such as the printed circuit board 50 illustrated in FIG. 5. In accordance with the present embodiments, the exposed die pad configurations, including, but not limited to, the configurations illustrated in FIGS. 5, 6, 7, and 8 can facilitate grounding the die pad to a printed circuit board according to specific application requirements.

Figure 9:
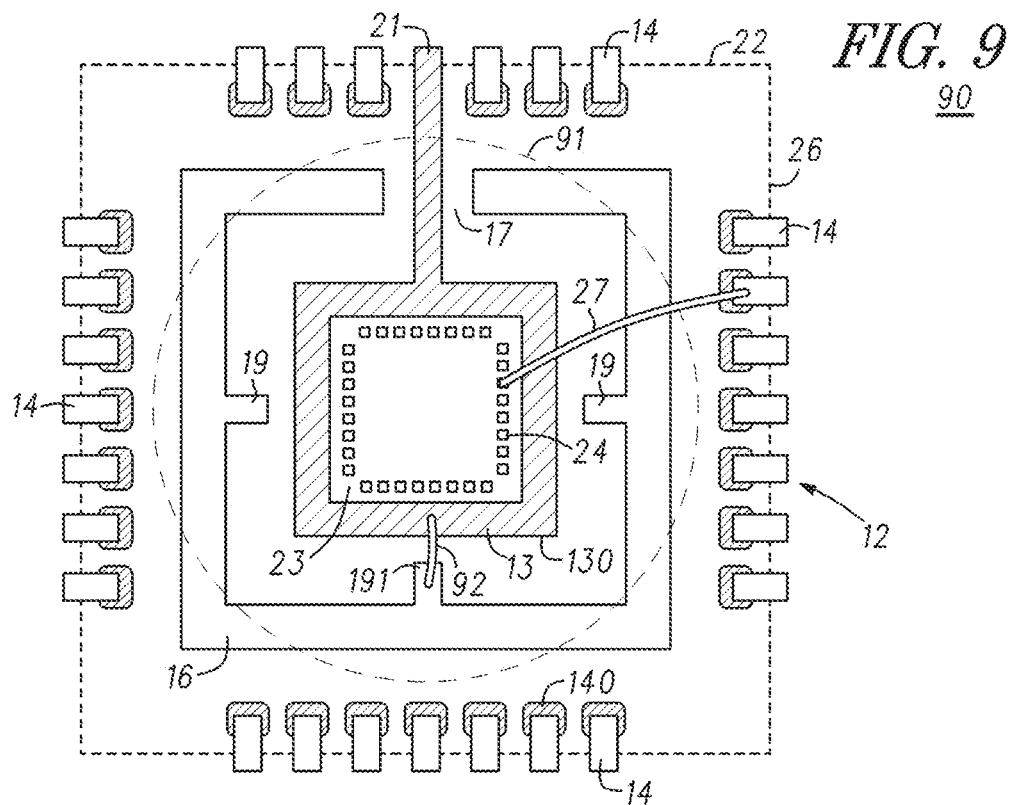
FIG. 9 illustrates a top view of an electronic device having an integrated antenna in accordance with another embodiment of the present invention.

A quarter-wavelength patch antenna is similar in configuration and design to microstrip or patch antennas 11, 41, 61, 71, and 81 described previously. FIG. 9 illustrates a top view of a packaged electronic device 90 or electronic device 90 having an integrated antenna 91 configured as quarter-wavelength antenna in accordance with an embodiment. Electronic device 90 is similar to electronic devices 10 and 40, and only the differences will be described hereinafter. In accordance with the present embodiment, integrated antenna 91 is configured so that far end 130 or distal end 130 (i.e., the end disposed opposite to elongated conductive beam structure 21) of die pad 13 is shorted to ground plane structure 16. In the present embodiment, ground plane structure 16 is otherwise physically separated everywhere else from die pad 13 by package body 26. In one embodiment, a conductive finger 191 extending from ground plane structure 16 towards die pad 13 and a conductive connective structure 92, such as shorting wire 92 electrically connect die pad 13 to ground plane structure 16. In accordance with the present embodiment, because die pad 13 (or the patch portion of integrated antenna 91) is shorted at distal end 130 to ground plane structure 16, the current at the distal end 130 of the integrated antenna 91 will not be forced to zero, which is the case with the integrated microstrip antenna designs described previously. In accordance with the present embodiment, integrated antenna 91 comprises die pad 13, ground plane structure 16, elongated conductive beam structure 21, and shorting pin 92.

The configuration in accordance with the present embodiment results in a similar current-voltage distribution as a half-wave patch antenna. However, one functional difference of the present embodiment is that the fringing fields, responsible for the radiation of integrated antenna 91, are shorted at distal end 130 (i.e., the end opposite to transmission line 21) of die pad 13 (i.e., the patch), and hence, only electric fields nearest elongated conductive beam structure 21 radiate or are active. Additionally, in electronic device 90, the gain is reduced; however, it was unexpectedly found that integrated antenna 91 maintains the same basic properties of operation as exhibited in a half-wave patch design while reducing the size of the antenna by at least 50% (λ/4— quarter wave). In alternative embodiments of electronic device 90, die pad 13 can be in a bottom-exposed configuration (similar to, for example, electronic device 40), can be in a non-exposed configuration (similar to, for example, electronic device 10), and/or can be in a top-exposed configuration (similar to, for example, electronic devices 60 or 70).

Figure 10:
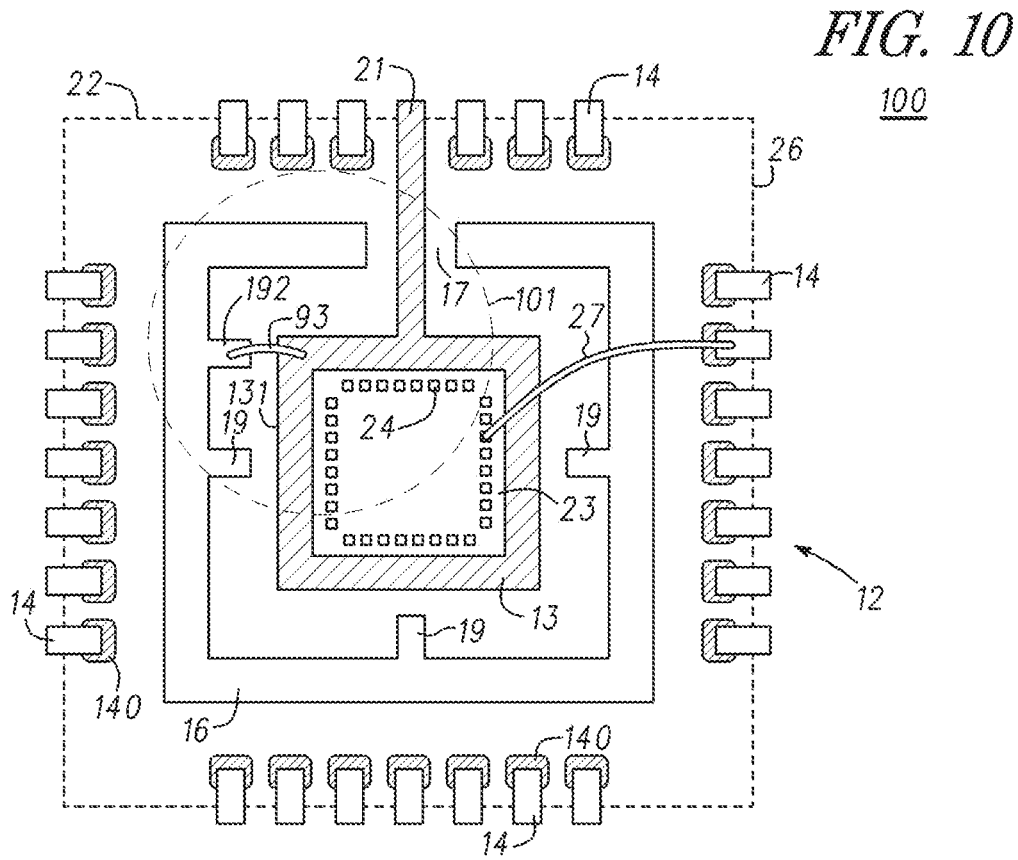
FIG. 10 illustrates a top view of an electronic device having an integrated antenna in accordance with a further embodiment of the present invention.

FIG. 10 illustrates a top view of a packaged electronic device 100 or electronic device 100 having an integrated antenna 101 configured as a half-wavelength antenna in accordance with an embodiment. The half-wavelength patch antenna is a variation of the quarter-wavelength patch antenna. Electronic device 100 is similar to electronic devices 10, 40, and 90, and only the differences will be described hereinafter. In accordance with the present embodiment, integrated antenna 101 is configured so that an adjacent side 131 (i.e., the side disposed adjacent the side of die pad 13 connected to elongated conductive beam structure 21; or adjacent the feed or source end of the patch portion of integrated antenna structure 101) of die pad 13 is shorted to ground plane structure 16. In the present embodiment, ground plane structure 16 is otherwise physically separated everywhere else from die pad 13 by package body 26.

In one embodiment, a conductive finger 192 extending from ground plane structure 16 towards die pad 13 and a conductive connective structure 93, such as shorting wire 93 electrically connect die pad 13 to ground plane structure 16. In accordance with the present embodiment, grounding wire 93 is configured to introduce a parallel inductance to the impedance of integrated antenna 101, which is a result of the patch antenna design and frequency of the application. More particularly, the resultant parallel inductance shifts the resonance frequency of integrated antenna 101. In accordance with the present embodiment, by varying the location of shorting wire 93 together with the admittance and reactance of integrated antenna 101, the resonant frequency can be modified and optimized (i.e., tuned) for a particular application. Integrated antenna 101 configured as a half-wavelength antenna can be used in applications, including, but not limited to applications requiring operation at frequencies greater than or equal to about 1 GHz. In accordance with the present embodiment, integrated antenna 101 comprises die pad 13, ground plane structure 16, elongated conductive beam structure 21, and shorting pin 93. In alternative embodiments of electronic device 100, die pad 13 can be in a bottom-exposed configuration (similar to, for example, electronic device 40), can be non-exposed (similar to, for example, electronic device 10), and/or can be top-exposed (similar to, for example, electronic devices 60 or 70).

Figure 11:
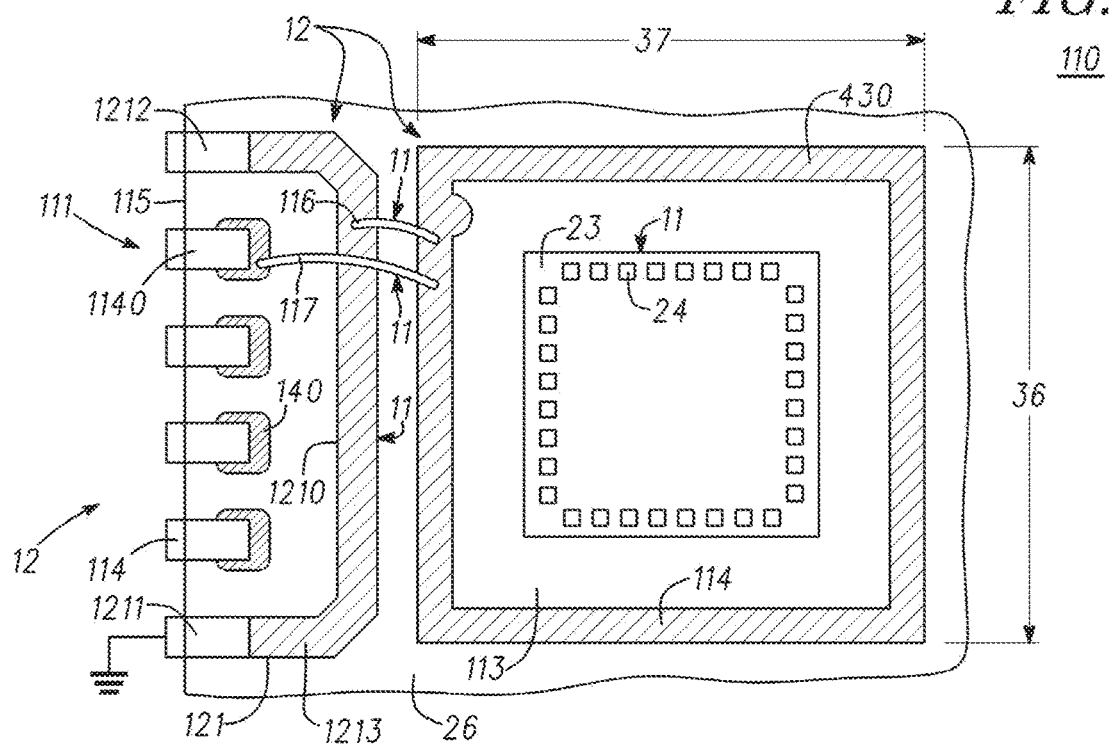
FIG. 11 illustrates a partial top view of an electronic device having an integrated antenna in accordance with an embodiment of the present invention.

FIG. 11 illustrates a partial top view of a packaged electronic device 110 or electronic device 110 having an integrated antenna 111 in accordance with a first embodiment of a Planar Inverted F-Antenna ("PIFA") configuration. The PIFA is another type of planar antenna that can be used in several applications, including, for example, mobile, wireless-handheld devices such as mobile phones, tablets, Wi-Fi cards, RF tags, as well as others. PIFA's are low-profile designs, omnidirectional, configurable into many different form factors, and resonant at a quarter wavelength (λ/4). As a result, in accordance with the present embodiment, PIFA's can be made small, configured in different form factors, and integrated into or within a packaged electronic device in accordance with the present description.

In accordance with the present embodiment, electronic device 110 includes a conductive substrate 12, such as a leadframe 12, which has a die attach pad 113, die paddle 113, or die pad 113, an elongated conductive body 121, elongated conductive beam structure 121, conductive fused lead structure 121, or elongated ground loop portion 121, and a plurality of leads 114. In one embodiment, elongated ground loop portion 121 is configured as a u-shaped member with an open portion of the u-shape disposed facing opposite to die pad 113. It is understood that electronic device 110 can include additional leads 114 including additional leads disposed proximate to other peripheral side surfaces of die pad 113.

In one embodiment, die pad 113 is configured similar to die pad 43 illustrated in FIG. 3. In one embodiment, die pad 113 includes edge portion 430 that is reduced in thickness and that, in one embodiment, extends around the peripheral side surfaces of die pad 113. The reduced thickness is illustrated by the condensed hatching that slopes downwardly from right to left in FIG. 11. In accordance with the present embodiment, die pad 113 is configured as a patch portion or patch structure for integrated antenna 111. More particularly, die pad 113 has width 37 and height 36 selected, for example, for a quarter wavelength.

In the present embodiment, elongated conductive ground loop portion 121 has a length greater than or equal to height 36 of die pad 113, and partially encloses leads 114 on one side 115 of electronic device 110. Elongated conductive ground loop portion 121 includes a portion 1210 partially etched similar to edge portion 430 of die pad 113. Elongated ground loop portion 121 includes a first bonding portion 1211 on one end and a second bonding portion 1212 disposed at an opposite end. First bonding portion 1211 and second bonding portion 1212 can have a full thickness to facilitate attachment to a next level of assembly, such as a printed circuit board. Integrated antenna 111 also includes a conductive connective structure 116, conductive pin 116, or shorting pin 116 electrically connecting elongated conductive ground loop portion 121 to one end of die pad 113. Integrated antenna 111 further includes a conductive connective structure 117, conductive pin 117, source pin 117, or probe feed pin 117 electrically connecting die pad 113 to one of leads 114 designated as a probe feed lead 1140 or source lead 1140.

In accordance with the present embodiment, integrated antenna 111 is resonant at a quarter wavelength by placing shorting pin 116 at one end of die pad 113. In one embodiment, shorting pin 116 is placed at an end of die pad 113 opposite to the end of die pad 113 adjacent to first bonding portion 1211. The placement of probe feed pin 117 is between an open end 1213 of elongated ground loop portion 121 and the end shorted by shorting pin 116. In accordance with the present embodiment, input impedance of integrated antenna 111 is determined, at least in part, by the placement of shorting pin 116. By way of example, the closer probe feed lead 1140 is to shorting pin 116, the lower the input impedance will be, and variations of input impedance will be illustrated in a later embodiment. By way of further example, if it desired to increase input impedance for tuning purposes, this can be done, for example, by placing probe feed lead 1140 further apart from shorting pin 116.

In one embodiment, leads 114 are similar to leads 14 and can be configured to have portions 140 partially etched to provide a locking mechanism for package body 26. Electronic device 110 is further illustrated with electronic component 23, which is further illustrated with bond pads 24 disposed over one surface of electronic component 23. Electronic device 110 is also illustrated with package body 26, which can have pre-selected material characteristics as described previously. In one embodiment, lower surfaces of die pad 113, leads 114 and portions 1211 and 1212 of elongated group loop portion 121 are exposed through surfaces of package body 26. In accordance with the present embodiment, package body 26 encapsulates, fully covers, or encloses shorting pin 116 and probe feed pin 117, which can enhance field effects and helps with frequency tuning. Although not illustrated, electrical component 23 can be electrically connected to leads 114, other leads, and/or die pad 113 using conductive connective structures, such as wire bonds 27 or other conductive structures as known to those of ordinary skill in the art.

Figure 12:
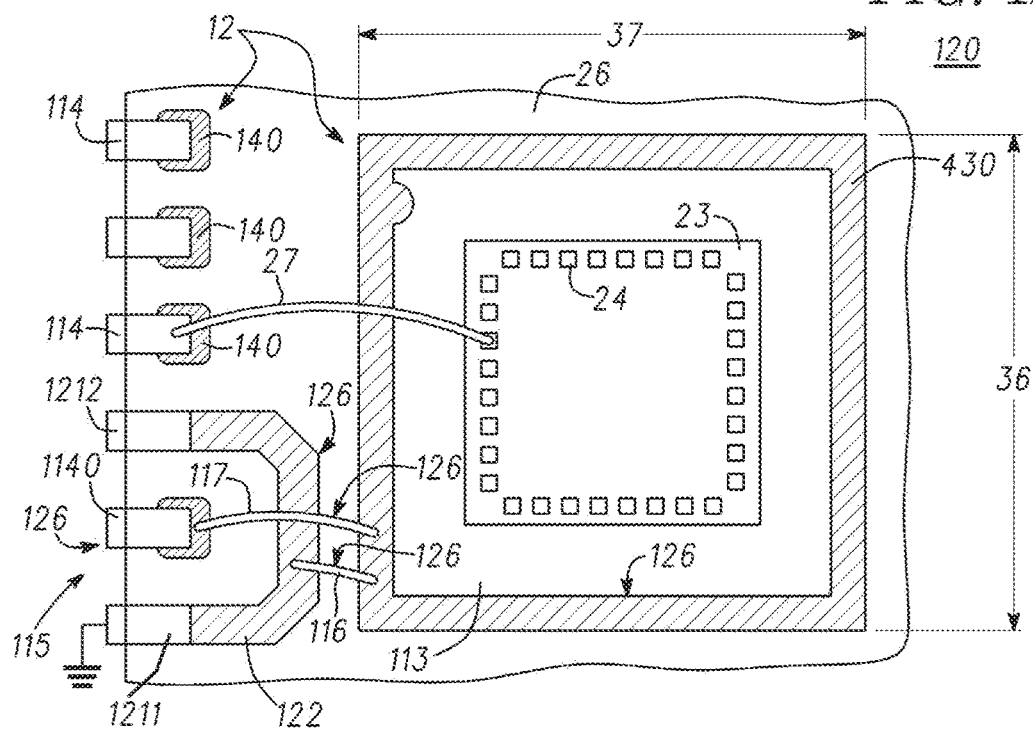
FIG. 12 illustrates a partial top view of an electronic device having an integrated antenna in accordance with another embodiment of the present invention.

FIG. 12 illustrates a partial top view of a packaged electronic device 120 or electronic device 120 having an integrated antenna 126 in accordance with another embodiment of a PIFA configuration. Electronic device 120 is similar to electronic device 110 and only the differences will be described hereinafter. In accordance with the present embodiment, electronic device 120 includes an elongated conductive body 122, elongated conductive beam structure 122, or elongated ground loop portion 122, which extends only partially along one peripheral side surface of die pad 113. In one embodiment, elongated ground loop portion 122 is configured as a smaller or tighter ground loop compared to elongated ground loop portion 121 illustrated in FIG. 11. In one embodiment, elongated ground loop portion 122 is configured as a u-shaped member with the open portion disposed opposite to die pad 113. In some embodiments, elongated ground loop portion 122 at least partially encloses (e.g., partially encloses on one or more sides) or partially encompasses probe feed lead 1140 only while other leads 114 are not enclosed or encompassed by elongated ground loop portion 122. In other embodiments, elongated ground loop portion 122 may at least partially enclose one or more leads 114, and other leads 114 within electronic device 120 may be disposed external to elongated ground loop portion 122. In accordance with the present embodiment, elongated conductive beam structure 122 is configured to have two opposing ends that terminate in conductive lead structures 1211 and 1212 disposed along one edge of package body 26. In the present embodiment, integrated antenna 126 comprises die pad 113, elongated ground loop portion 122, shorting pin 116, probe feed pin 117, and probe feed lead 1140. In accordance with the present embodiment, integrated antenna 126 is suitable for smaller body packages and for applications or designs where the input impedance is expected to be minimal (either by design or operation).

Figure 13:
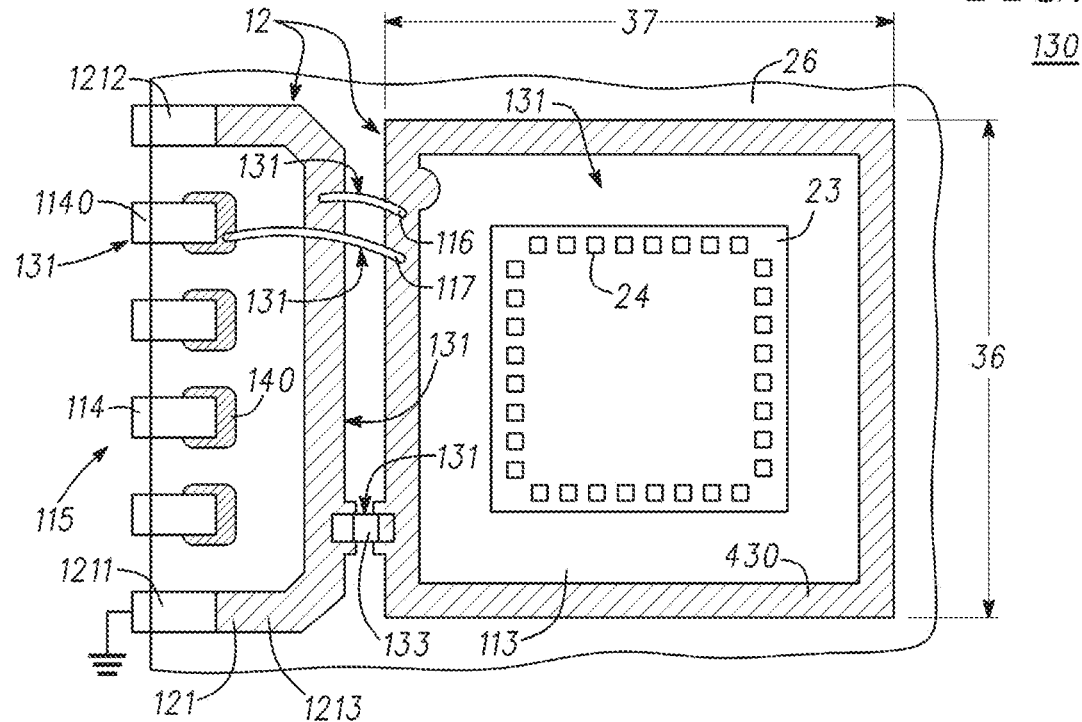
FIG. 13 illustrates a partial top view of an electronic device having an integrated antenna in accordance with a further embodiment of the present invention.

In alternative embodiments of PIFA configurations in accordance with the present invention, it may be desirable to load the PIFA antenna. This can be useful when the antenna element is very small and does not resonate as needed. In accordance with one embodiment, the PIFA configuration can be loaded by adding a passive device, such as a capacitor to offset or counter the inductance of the antenna structure. FIG. 13 is a partial top view of a packaged electronic device 130 or electronic device 130 having an integrated antenna 131. Electronic device 130 is similar to electronic device 110 and only the differences will be described hereinafter. In the present embodiment, a passive component 133, such as a capacitor 133 or a loading capacitor 133 is disposed electrically connected to elongated ground loop portion 121 and die pad 113. In accordance with one preferred embodiment, capacitor 133 is disposed away from (i.e., not adjacent to) probe feed pin 117. In one embodiment, capacitor 133 is disposed proximate to open end 1213 of elongated ground loop portion 121 as generally illustrated in FIG. 13.

In accordance with the present embodiment, the distance capacitor 133 is positioned within electronic device 130 can be determined by the frequency of operation, the size of the chip capacitor used, the characteristics of elongated ground loop portion 121 (e.g., material thickness and width) and the path used in the design. Also, the value of capacitor 133 can be determined based on the size of package body 26 and the size of die pad 113. The material used for package body 26 also impacts the value of capacitor 133, particularly in small body devices. In one embodiment, the value of capacitor 133 can be in a range from 2 picofarads to about 100 picofarads. It is noted that in some embodiments, if the capacitance value is too large, it will reduce the effective radiation of the integrated antenna and affect its efficiency. In accordance with one embodiment, integrated antenna 131 comprises die pad 113, elongated ground loop portion 121, shorting pin 116, probe feed pin 117, probe feed lead 1140, and passive component 133. In accordance with the present embodiment, elongated conductive beam structure 121 is configured to have two opposing ends that terminate in conductive lead structures 1211 and 1212 disposed along one edge of package body 26.

Figure 14:
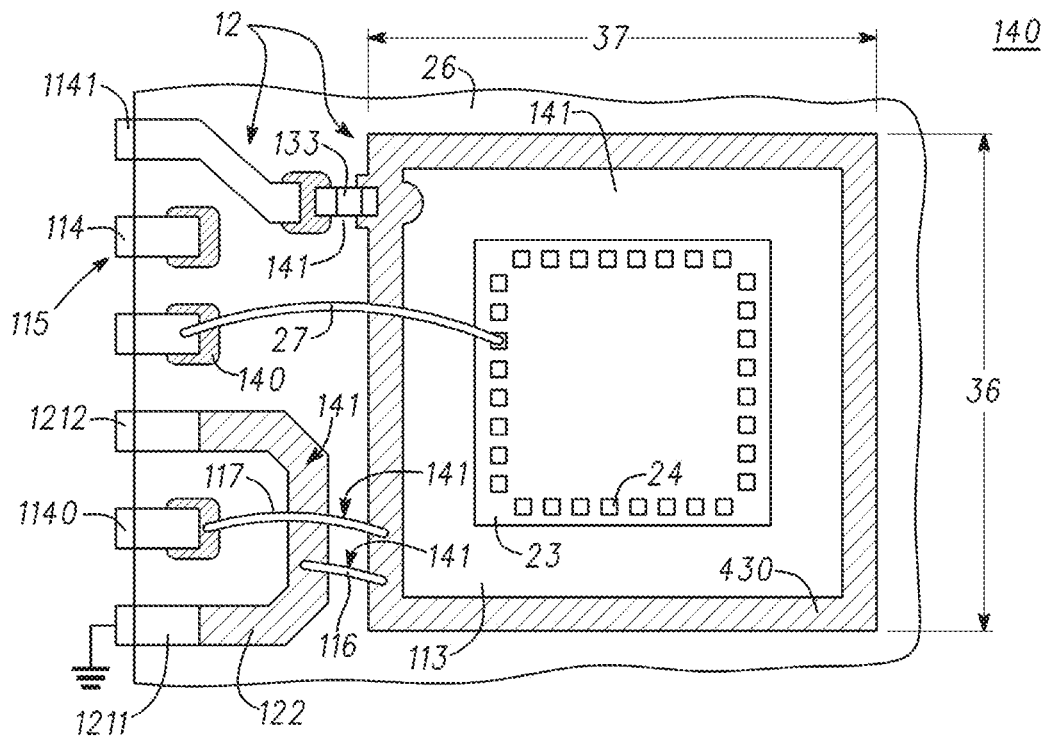
FIG. 14 illustrates a partial top view of an electronic device having an integrated antenna in accordance with another embodiment of the present invention.

FIG. 14 illustrates a partial top view of a packaged electronic device 140 or an electronic device 140 having an integrated antenna 141 in accordance with another embodiment. Electronic device 140 is similar electronic devices 120 and 130 and only the differences will be described hereinafter. In accordance with the present embodiment, electronic device 140 further includes passive component 133, such as capacitor 133 or loading capacitor 133 disposed electrically connecting a lead 1141 to die pad 113. In one embodiment, lead 1141 is disposed proximate to an end of die pad 113 opposite to the end of die pad 113 where probe feed pin 117 is disposed. In accordance with the present embodiment, integrated antenna 141 comprises die pad 113, elongated ground loop structure 122, shorting pin 116, probe feed pin 117, probe feed lead 1140, passive component 133, and lead 1141 electrically connected to passive component 133. In accordance with the present embodiment, elongated conductive beam structure 122 is configured to have two opposing ends that terminate in conductive lead structures 1211 and 1212 disposed along one edge of package body 26.

Figure 15:
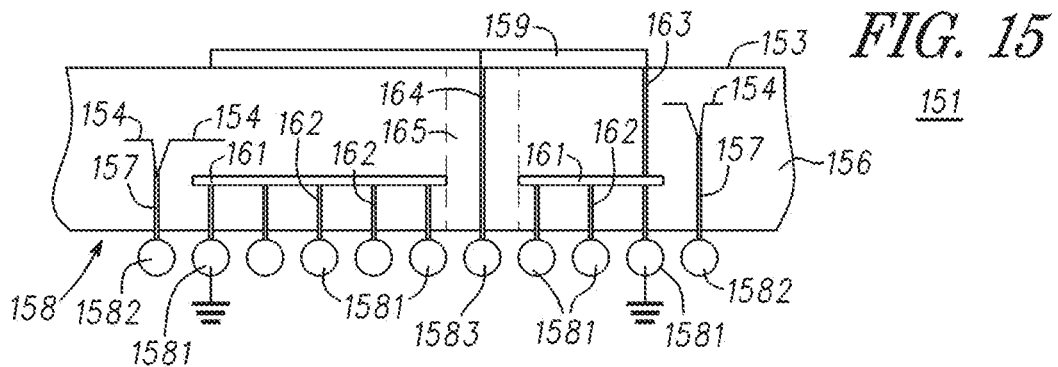
FIG. 15 illustrates a partial cross-sectional view an antenna structure for integration within a packaged electronic device in accordance with the present invention.

FIG. 15 illustrates a partial cross-sectional view of an antenna structure 151 suitable for integration within a packaged electronic device, which includes a substrate 153 or a laminate substrate 153, such as a multilayer laminate substrate 153. In the present embodiment, antenna structure 151 is configured a PIFA structure for integration within a packaged electronic device, such as one or more semiconductor components and/or one or more passive components and a package body, such as a molded package body. In one embodiment, laminate substrate 153 comprises multiple conductive layers, such as conductive traces 154 separated by insulating material 156 or one or more insulating layers 156. In one embodiment, conductive traces 154 can be electrically interconnected using, for example, conductive via structures 157. Conductive structures 158, such as solder structures 158, are disposed on one side of substrate 153 and a conductive patch layer 159 is disposed on an opposing side of substrate 153.

In accordance with the present embodiment, solder structures 158 include a plurality of grounding structures 1581 that are electrically connected to an embedded ground plane 161 disposed within substrate 153. In one embodiment, grounding structures 1581 are electrically connected to embedded ground plane 161 using ground pins 162 or conductive ground vias 162, which extend into substrate 153 to embedded ground plane 151. In one embodiment, solder structures 158 further include signal structures 1582 that are electrically connected to conductive traces 154 within substrate 153. In one embodiment, signal structures 1582 are electrically connected to conductive traces 154 using conductive vias 157. In one embodiment, patch layer 159 is electrically connected to or electrically shorted to embedded ground plane 161 using a conductive via 163 or conductive pin 163. Solder structures 158 further include a feed structure 1583 or source structure 1583 that is electrically connected to patch layer 159 using a conductive via 164 or conductive pin 164. In accordance the present embodiment, conductive pin 164 extends through substrate 153 and passes through, for example, an opening 165 or gap 165 in embedded ground plane 161.

Figure 16:
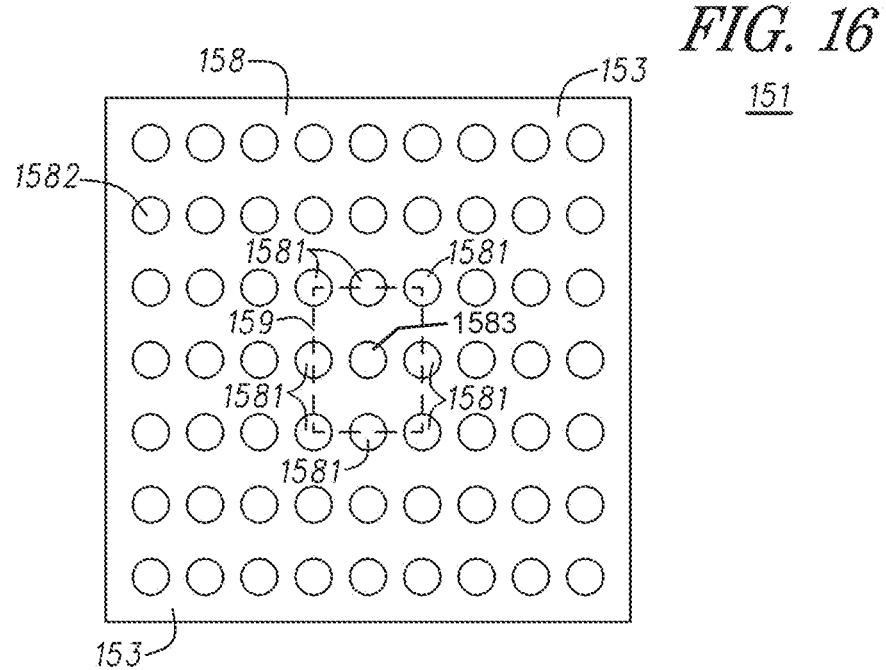
FIG. 16 illustrates a bottom view of the embodiment of FIG. 15.

FIG. 16 illustrates a bottom view of antenna structure 151 including grounding structures 1581, signal structures 1582, and feed structure 1583 disposed below or overlapping patch layer 159 (illustrated as a dashed line). In one embodiment, feed structure 1583 and grounding structures 1581 can be provided symmetrically centered to the package body dimensions. In other embodiments, feed structure 1583 and grounding structures 1581 can be positioned at other locations on and/or within substrate 153 according to design requirements. Additionally, antenna structure 151 can be tuned using, for example, one or more passive components, to achieve selected efficiency and performance.

Figure 17:
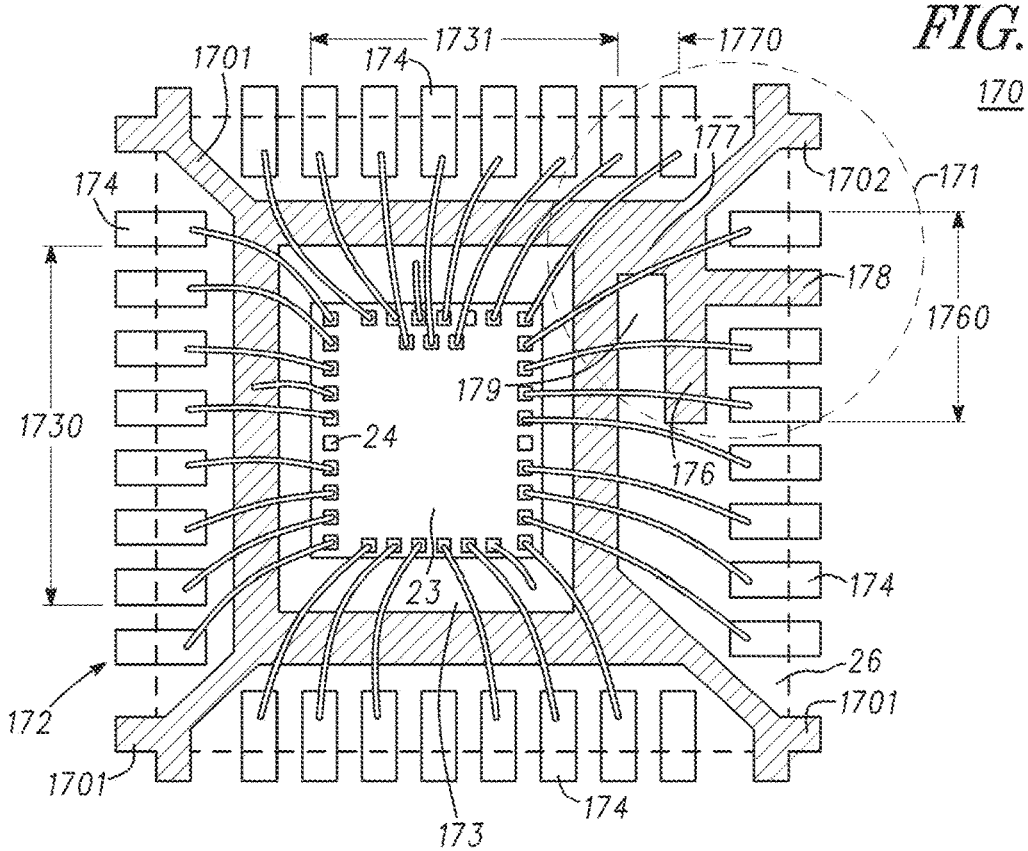
FIG. 17 illustrates a top view of an electronic device having an integrated antenna in accordance with an embodiment of the present invention.

FIG. 17 illustrates a top view of a packaged electronic device 170 or an electronic device 170 having an integrated antenna 171 in accordance with an inverted F-antenna ("IFA") embodiment. In accordance with the present embodiment, electronic device 170 includes a substrate 172 or conductive substrate 172, such as a conductive leadframe 172 or leadframe 172. In one embodiment, leadframe 172 includes a generally rectangular die paddle 173 or die pad 173 defining four peripheral edge segments and a plurality of first leads 174 or leads 174. In one embodiment, leads 174 can be segregated into four (4) sets, with each set of leads 174 disposed spaced apart from die pad 173 and extending generally perpendicularly from a corresponding one of the peripheral edge segments of die pad 173. It is understood that leadframe 172 may include more or fewer leads than illustrated in the present embodiment, including, for example, additional rows of leads.

In accordance with the present embodiment, die pad 173 is configured to both receive electronic component 23 as part of electronic package 170, and is configured as a ground plane structure for integrated antenna 171. In accordance with the present embodiment, integrated antenna 171 further comprises an elongated conductive beam structure 176, elongated conductive body 176, conductive arm 176, conductive transmission line 176, or planar rectangular conductive element 176. In one embodiment, conductive arm 176 can be attached to die pad 173 with an elongated conductive beam structure 177 or conductive shorting arm 177. It is understood that conductive arm 176 and conductive shorting arm 177 can be collectively referred to as an elongated conductive beam structure having two portions oriented perpendicular to each other. In one embodiment, conductive shorting arm 177 is attached and integral with die pad 173 and extends generally perpendicularly outward from one of the peripheral edge segments of die pad 173 and proximate to one corner. More particularly, die pad 173, conductive shorting arm 177, and conductive arm 176 comprise a unitary body.

In one embodiment, conductive arm 176 extends generally perpendicular from an end portion of conductive shorting arm 177, and further extends generally parallel to the same peripheral edge segment of die pad 173 where conductive arm 176 is attached to die pad 173. In one embodiment, integrated antenna 171 further includes a conductive feed 178 or conductive source lead 178 that extends generally perpendicular and outward from conductive arm 176 towards an outer edge of package body 26. A gap 179 is disposed between conductive arm 176 and the adjacent peripheral edge segment of die pad 173. In one embodiment, gap 179 is filled with insulating material, such as the mold compound used to form package body 26.

Note that in some embodiments, it is preferred that conductive source lead 178 is disposed closer to conductive shorting arm 177 than to the distal end of conductive arm 176. More particularly, in accordance with the present embodiment, the location of conductive source lead 178 is selected to substantially null the capacitance between the distal end of conductive arm 177 and conductive source lead 178 and the inductance between conductive shorting arm 177 and conductive source lead 178. With the capacitance and inductance cancelled out or their effects reduced, only radiation resistance remains in integrated antenna 171.

Due to its small size (e.g., $\lambda/4$), integrated antenna 171 in the IFA configuration can be used in several applications, such as wireless handheld devices. Integrated antenna 171 comprises conductive arm 176 disposed above or spaced apart from die pad 173, which is configured as the ground plane, conductive shorting arm 177, which grounds conductive arm 176 to die pad 173, and a conductive feed source 178, which is electronically connected to conductive arm 176. In some embodiments, conductive arm 176 has a length that corresponds to roughly a quarter of a wavelength. The IFA configuration is a variant of a monopole configuration where the top section has been folded down (i.e., conductive upper arm 176) so as to be parallel with the ground plane (i.e., die pad 173). This is done, for example, to reduce the height of integrated antenna 171, while maintaining a resonant trace length. In some embodiments, conductive upper arm 176 can introduce capacitance to the input impedance of integrated antenna 171, which can be compensated by conductive shorting arm 177. Conductive shorting arm 177 can be formed in different configurations depending on the application; one such variation of the configuration will be described in conjunction with FIG. 18.

In the present embodiment, the polarization of integrated antenna 171 is vertical, and the radiation pattern is roughly donut-shaped, with the axis of the donut in a direction roughly parallel to conductive feed 178. In one embodiment for more optimum radiation, die pad 173 is configured to have a width 1730 at least as wide as the length 1760 of conductive arm 176; and die pad 173 should be at least $\lambda/4$ in height 1731. If the height 1731 of the die pad 173 is smaller, the bandwidth and efficiency will decrease. The height 1770 of conductive shorting arm 177 is configured to be a small fraction of a wavelength of integrated antenna 171. However, the effective radiation and impedance properties of integrated antenna 171 were found not to be a strong function of height 1770.

In some embodiments of electronic device 170, die pad 173 is disposed above the plane ($\lambda/4$) of conductive source lead 178. That is, in some embodiments, die pad 173 and conductive source lead 178 are disposed on different but substantially parallel planes. By way of example, electronic device 170 can be configured in a top-exposed pad packaged device, similarly to electronic device 60 illustrated in FIG. 6; or configured in an off-set non-exposed die pad configuration similar to electronic device 10 in FIG. 2 with conductive source lead 178 off-set up or down in relation to die pad 173. By way of example, the condensed hatching represents that die pad 173 and at least conductive source lead 178 are disposed on different horizontal planes.

In one embodiment, electronic device 170 further includes a plurality of tie bars 1701 extending generally diagonally from corner portions of die pad 173 towards corner portions of package body 26. In one embodiment, tie bar 1702 extends from a corner of conductive shorting arm 177 towards another corner portion of package body 26. Conductive connective structures 27, such as wire bonds 27 electrically connect bond pads 24 on electronic component 23 to leads 174, and, in some embodiments, to die pad 173. In accordance with the present embodiment, conductive source lead 178 is disposed between a pair of leads 174 and is configured for electrically connecting integrated antenna 171 to an external feed source. Advantageously, conductive source lead 178 is configured within leadframe 172 to terminate at an edge or side of package body 26 similarly to leads 174.

Figure 18:
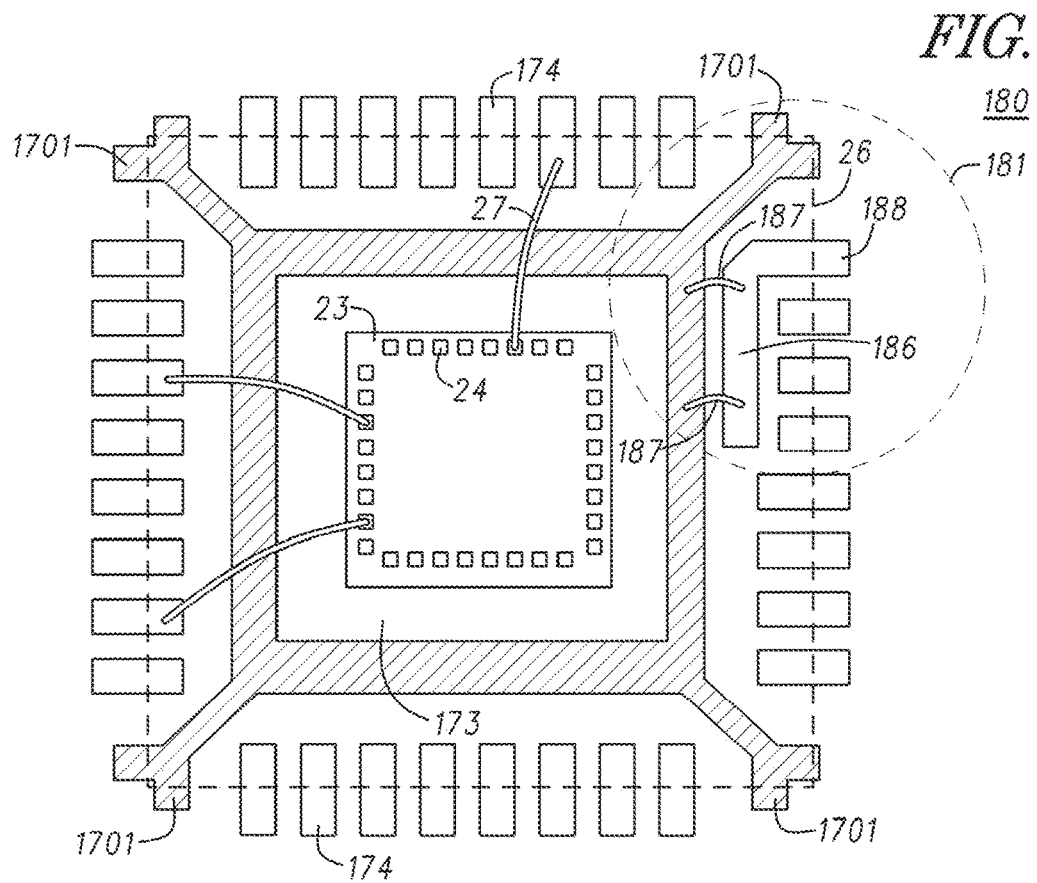
FIG. 18 illustrates a top view of an electronic device having an integrated antenna in accordance with another embodiment of the present invention.

FIG. 18 illustrates top view of a packaged electronic device 180 or an electronic device 180 having an integrated antenna 181 in accordance with another embodiment of an IFA configured antenna. Electronic device 180 is similar to electronic device 170 and only the differences will be described hereinafter. In particular, integrated antenna 181 compromise die pad 173, an elongated conductive beam structure 186, elongated conductive body 186, conductive arm 186, conductive transmission line 186, or planar rectangular conductive element 186, and a conductive feed 188 or conductive source lead 188 that extends generally perpendicular and outward from conductive arm 186 towards an outer edge of package body 26. Instead of a shorting arm, integrated antenna 181 includes one or more conductive connective structures 187, such as wire bonds 187 or clips 187 that electrically short conductive arm 186 to die pad 173. In one preferred embodiment, wire bonds 187 comprise gold wires having a diameter greater than or equal to about 20 microns (greater than or equal to about 0.8 mils).

Figure 19:
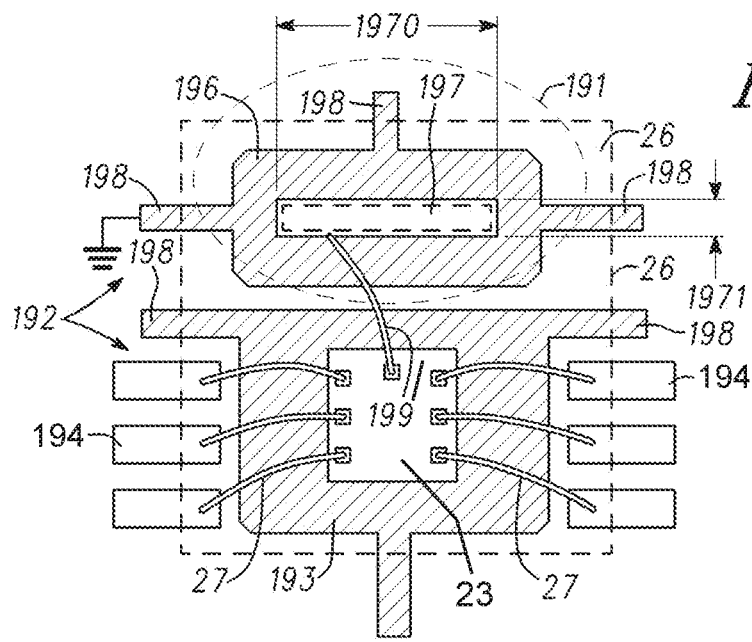
FIG. 19 illustrates a top view of an electronic device having an integrated antenna in accordance with an embodiment of the present invention.

FIG. 19 illustrates a top view of a packaged electronic device 190 or an electronic device 190 having an integrated antenna 191 in accordance with an integrated slot antenna embodiment. In accordance with the present embodiment, electronic device 190 comprises a substrate or conductive substrate 192, such as a conductive leadframe 192 or leadframe 192. In one embodiment, leadframe 192 comprises a generally rectangular die paddle 193, die pad 193, or first die pad 193 defining four peripheral edge segments and a plurality of leads 194 or leads 194. In one embodiment, leads 194 can be segregated into two (2) sets, with each set of leads 194 disposed spaced apart from die pad 193 and extending generally perpendicularly from a corresponding one of opposing peripheral edge segments of die pad 193. It is understood that leadframe 192 may include more or fewer leads than illustrated in the present embodiment.

In accordance with the present embodiment, leadframe 192 further comprises an elongated conductive beam structure 196, an elongated conductive body 196, a conductive plate 196, conductive pad 196, or conductive paddle 196, which includes a slot 197, rectangular opening 197, or aperture 197 extending through conductive pad 196. In one preferred embodiment, slot 197 is substantially centrally located within conductive pad 196 such that the distance the ends and sides of slot 197 are spaced apart from edges of conductive pad 196 is substantially equal or uniform. In one embodiment, conductive pad 196 has a generally rectangular shape defining four peripheral edge segments including one that is adjacent to but spaced apart from die pad 193 to provide gap between them. In some embodiments, leadframe 192 further includes one or more tie bars 198 that extend from, for example, portions of die pad 193 and conductive pad 196 towards side surfaces of package body 26. In one embodiment, a source or feed structure 199 electrically connects electronic component 23, which is attached to first die pad 193, to conductive pad 196. In accordance with the present embodiment, integrated antenna 191 includes conductive pad 196 with slot 197 and source structure 199 in a slot antenna configuration. Slot 197 includes a length 1970 and a height 1971.

Slot antennas are typically used at frequencies between approximately 300 MHz and approximately 20 GHz. In the present embodiment, electronic component 23, such as semiconductor chip 23, is attached to die pad 193, which is isolated from conductive pad 196 used to form the slot antenna. In one embodiment, feed 199 is positioned off-centered relative to slot 197. To make slot antenna 191 resonate, the location of feed wire 199 as depicted in FIG. 19 becomes one primary consideration. More particularly, it is preferred feed 199 is not located on or at either end of slot 197 or in the center of any side of slot 197. To enable radiation of the antenna element, in some embodiments feed 199 can be positioned between the center of slot 197 and one end. In accordance with the present embodiment, the selected position is a function of the impedance relative to the operational frequency of integrated antenna 191. More particularly, if the impedance of the antenna to the left of feed 199 is >λ/4, then feed 199 behaves as though it were an inductor; and to the right of feed 199, feed 199 exhibits the behavior of a capacitor. When the position of feed 199 is designed and applied in accordance with the applicable design requirements, the inductance and the capacitance should substantially cancel. This leaves only radiation resistance to account for relative to the power required to cause integrated antenna 191 to resonate.

Typically, slot antennas are designed so the impedance is approximately 50Ω. In some embodiments, this is considered optimal impedance for efficient radiation of the antenna, but in practice can be a challenge to achieve for every case or application. In the case of the slot antenna being configured using a substrate type device such as a leadframe QFM or QFP, the positioning of the feed (source) can also affect the bandwidth performance of the antenna. In most designs, the expectation for center frequency performance of the slot antenna is approximately 7% of the designed frequency of operation. For example, for an operational center frequency of 1 GHz (a common frequency of operation for many wireless devices such as Bluetooth® and RF tags), the slot radiation was observed to be approximately 1 GHz±3.5%.

In some embodiments, slot 197 is void of material (i.e., material is absent). In other embodiments, slot 197 can be filled with air or an inert gas. Considering an over molded package level integration, slot 197 can be filled with EMC. Since the dielectric constant of the EMC and air are substantially the same, it was observed that integrated antenna 191 still resonates. If it is desirable or relevant to the application due to frequency requirements, bandwidth needs, and/or package level implementation constraints, to keep slot 197 devoid of EMC, this can be accomplished by using a Film Assisted Mold ("FAM") molding process.

In one embodiment of electronic device 190, package body 26 can be provided as an over molded package configuration. In one embodiment, the mold compound selected for package body 26 can have a dielectric constant greater than air, and within typical variances in assembly steps for die attach and wire bonding, both of which impact precise placement of feed 199, the bandwidth performance of integrated antenna 191 was observed to be within 10% of the desired center frequency of operation. For example: if the desired target frequency is 1 GHz, the slot radiation or bandwidth can be 1 GHz±5%.

Figure 20:
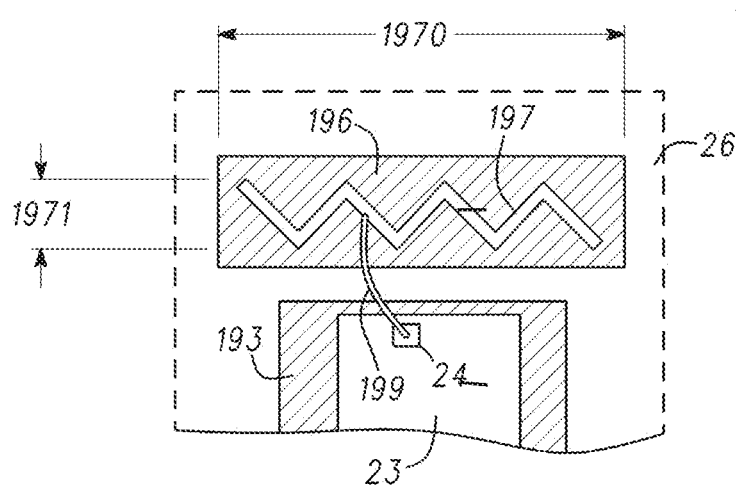
FIG. 20 illustrates a partial top view of an alternative embodiment of slot antenna in accordance with an embodiment the present invention.

In accordance with the present embodiment, the slot for integrated antenna 191 can be any size and shape so long as slot 197 is surrounded by a contiguous metal plane or ground place. In addition, the feed (i.e., feed 199) can be disposed to effectively form the desired electric field, thus resulting in the slot resonating. By way of example, FIG. 20 illustrates top view of an alternative embodiment of slot 197 designed in a serpentine shape to increase the interior area of the slot while maintaining length 1970 and height 1971 appropriate to the available area of electronic package 190. The shape of slot 197 is configured so that the perimeter of the shape equals a selected wavelength, but it is not required for the shape to be symmetrical or of a specific dimension or specific relative shape.

Figure 21:
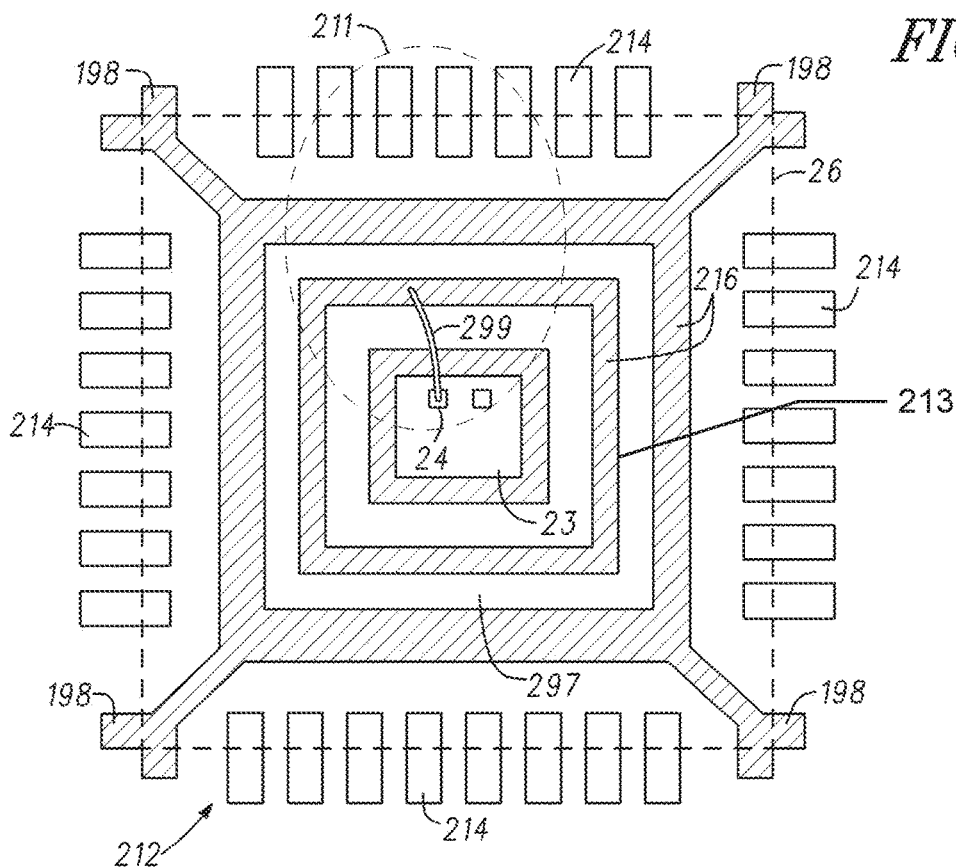
FIG. 21 illustrates a top view of an electronic device having an integrated antenna in accordance with an embodiment of the present invention.
Figure 22A:
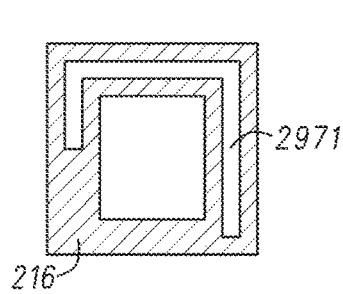
FIGS. 22A through 22F illustrate top views of alternative slot configurations for the embodiment of FIG. 21 in accordance with embodiments of the present invention.
Figure 22B:
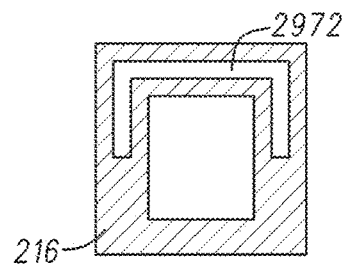
Figure 22C:
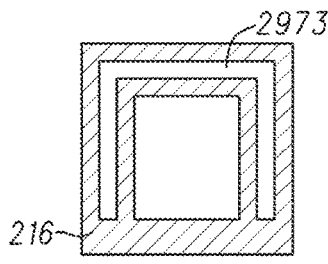
Figure 22D:
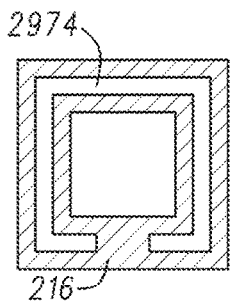
Figure 22E:
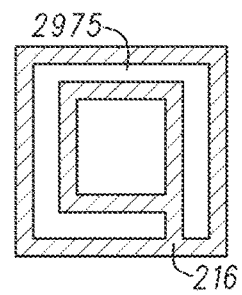
Figure 22F:
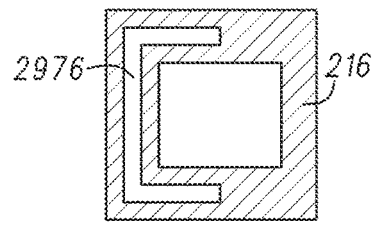

FIG. 21 illustrates a top view of a packaged electronic device 210 or electronic device 210 having an integrated antenna 211 configured as another embodiment of a slot antenna. In the present embodiment, electronic device 210 is configured as a QFN or QFP packaged device. Electronic device 210 includes a substrate 212, a conductive substrate 212, such as a conductive leadframe 212 or leadframe 212. In one embodiment, leadframe 212 includes a generally quadrangular die pad 213 and a plurality of leads 214 disposed spaced apart from die pad 213. In accordance with the present embodiment, leadframe 212 further comprises an elongated conductive beam structure 216 or an elongated conductive body 216 disposed between leads 214 and the die pad 213, which, in one embodiment, completely surrounds die pad 213. In accordance with the present embodiment, elongated conductive beam structure 216 is configured in ring-like shape and includes a slot 297, which can also completely surround die pad 213. In one embodiment, conductive feed 299 electronically connects electronic component 23 to elongated conductive beam structure 216. In one embodiment conductive feed 299 to an inner or inside portion of elongated conductive beam structure 216.

Package body 26 encapsulates the various components, and some components, such as die pad 213 and elongated conductive beam structure 216 can be non-exposed through one or more surfaces of package body 26. In other embodiments, die pad 213 and/or elongated conductive beam structure 216 can be exposed through one or more surfaces of package body 26. In accordance with the present embodiment, slot 297 can be configured into different shapes and/or lengths with the perimeter length adding to the desired wavelength for the selected application. FIGS. 22A-22F illustrate examples of different shape configurations 2971 through 2976 respectively that are suitable as alternative slots for elongated conductive beam structure 216.

Figure 23:
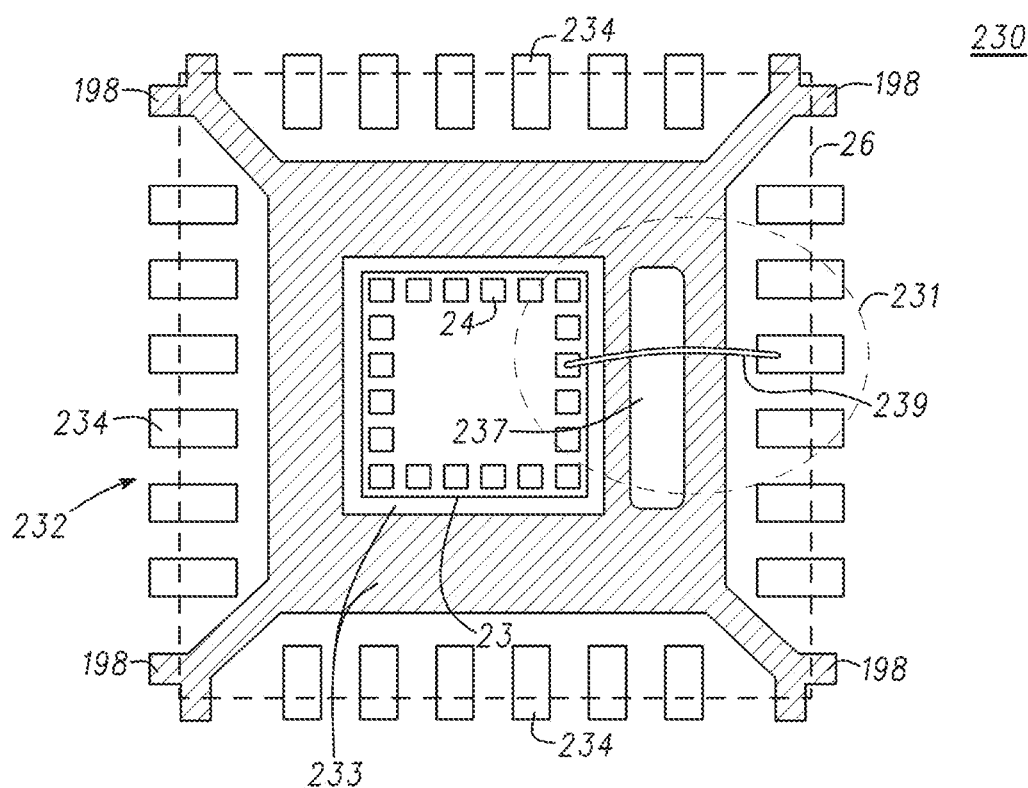
FIG. 23 illustrates a top view of an electronic device having an integrated antenna in accordance with an embodiment of the present invention.

FIG. 23 illustrates a top view of a packaged electronic device 230 or electronic device 230 with an integrated antenna 231 configured as an alternate embodiment of a slot antenna. Electronic device 230 comprises a substrate 232, a conductive substrate 232, such as a conductive leadframe 232 or leadframe 232. In one embodiment, leadframe 232 includes a generally rectangular die pad 233 and a plurality of leads 234 disposed spaced apart from die pad 233. In accordance with the present embodiment, die pad 233 is further configured with a slot 237, which is disposed in accordance with the present embodiment between electronic component 23 and one set of leads 234 and one side of package body 26. The length and height of slot 237 is determined as described previously such that its perimeter corresponds to the desired wavelength of integrated antenna 231. In accordance with the present embodiment, integrated antenna 231 further comprises a wave guide 239 electronically connecting a bond pad 24 on electronic component 23 to one of the leads 234.

In accordance with the present embodiment, wave guide 239 traverses, overlaps, or extends across a portion of slot 237, and some embodiments comprises a wire bond, such as a gold, silver or copper wire bond. Also, wave guide 239 has a diameter selected to have a reduced resistance relative to the desired frequency of operation for integrated antenna 231. It was observed that if the resistance of wave guide 239 is too large, the combination of the capacitance from package body 26 and the wire resistance can have an inductive effect, which reduces the radiation efficiency of integrated antenna 231. However, if the resistance is too small, the bandwidth of integrated antenna 231 can be limited and the frequency of operation can be difficult to stabilize. In accordance with some embodiments, the diameter of wave guide 239 can be between about 20 microns and about 26 microns (about 0.8 mils and about 1 mil). In accordance with the present embodiment, the position of wave guide 239 is preferably disposed off-center of slot 237 as described in previous slot antenna embodiments. In one embodiment, wave guide 239 is placed between the center and one end of slot 237.

Figure 24:
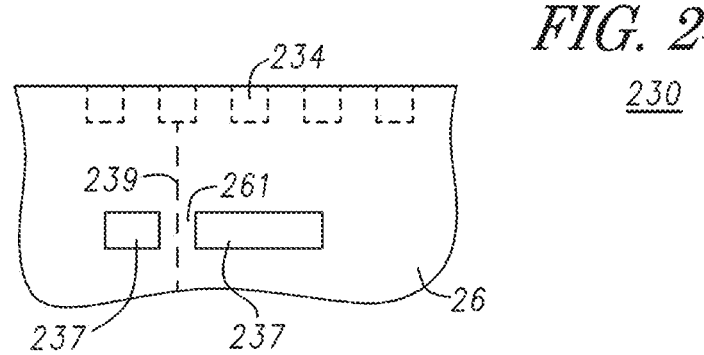
FIG. 24 illustrates a partial top view of a portion of the electronic device of FIG. 23 after additional fabrication in accordance with the present invention.

In accordance with the present embodiment, the height of the wire bond loop of wave guide 239 can be determined by design simulation. In one embodiment, a target maximum wire bond loop height that results in $\lambda/4$ at the peak of the wire loop was observed to provide more optimum radiation and enabling slot 237 to resonate. In some embodiments, the thickness of leadframe 232 is selected to support more optimum resonance behavior and is further determined in conjunction with the dimensions of slot 237 and the peak height of wave guide 239. The material chosen for package body 26 can have an impact on the overall performance of integrated antenna 231, for example, if slot 237 is filled with mold compound during the mold process. In some embodiments where capacitive effects of the mold compound adversely impact the resonate behavior of integrated antenna 231, FAM molding techniques can be used to keep slot 237 free from mold compound. However, in accordance with one embodiment using wave guide 239, using the FAM approach will open slot 237 only partially leaving wave guide 239 encapsulated within package body 26 as illustrated in FIG. 24. As illustrated in FIG. 24, package body 26 includes a bridge portion 261 that traverses slot 237 and encapsulates wave guide 239. It is understood that a portion of die pad 233 can be reduced in thickness as generally represented by the condensed hatching in FIG. 23.

Figure 25:
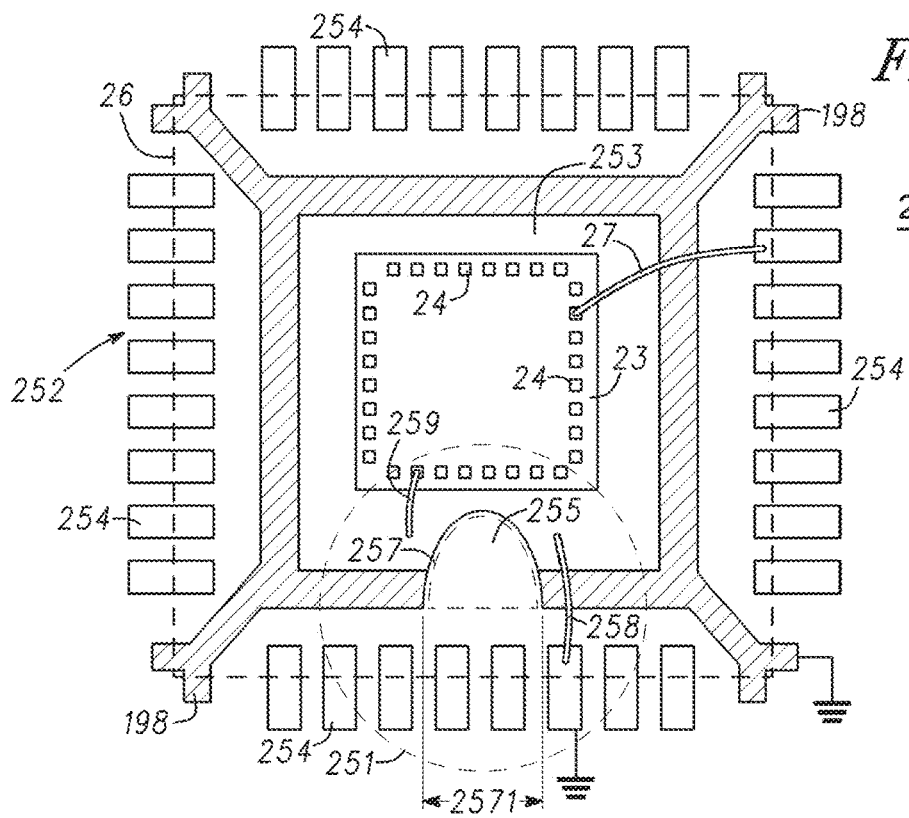
FIG. 25 illustrates a top view of an electronic device having an integrated antenna in accordance with an embodiment of the present invention.

FIG. 25 illustrates a top view of a packaged electronic device 250 or electronic device 250 having an integrated antenna 251 in a first embodiment of a Vivaldi antenna configuration. Electronic device 250 includes a substrate 252, a conductive substrate 252, such as conductive leadframe 252 or leadframe 252. In one embodiment, leadframe 252 includes a generally quadrangular die pad 253 and a plurality of leads 254 disposed spaced apart from die pad 253. In one embodiment, die pad 253 is further configured with one or more tie bars 198, which can extend from corner portions of the die pad 253 towards corner portions of package body 26 as generally illustrated in FIG. 25.

In accordance with the present embodiment, integrated antenna 251 is configured as a Vivaldi antenna, which is a type of planar antenna having a broadband in its operation. In general, integrated antenna 251 is configured with an antenna feed 259 that is electrically connected to electronic component 23 and die pad 253. In accordance with the present embodiment, die pad 253 is further configured with a slot 257 disposed extending inward from peripheral edge segment of die pad 253. In one embodiment, slot 257 is substantially centrally located along a peripheral edge segment as generally illustrated in FIG. 25. Slot 257 is configured to provide integrated antenna 251 with a low resonance component and a broad high frequency resonance component. In accordance with the present embodiment, slot 257 is configured having a curved shape that enables integrated antenna 251 to resonate, and a slot width 2571 proximate to the edge of die pad 253. In accordance with the present embodiment, the resonant frequency of integrated antenna 251 is controlled by the placement of a conductive feed 259. By way of example, the closer feed 259 is placed to the outer edge of slot 257, the higher the resonant frequency. In some embodiments, the area within slot 257 can be filled with mold compound as part of package body 26. In other embodiments, the area within slot 257 can be void or free of mold compound (represented by dashed shaped void or cavity 255) in a reduced capacitance configuration. In one embodiment, FAM process techniques can be used to provide void 255. Integrated antenna 251 further includes a ground pin 258 or ground wire 258 that is configured to electrically connect die pad 253 to ground.

Figure 26:
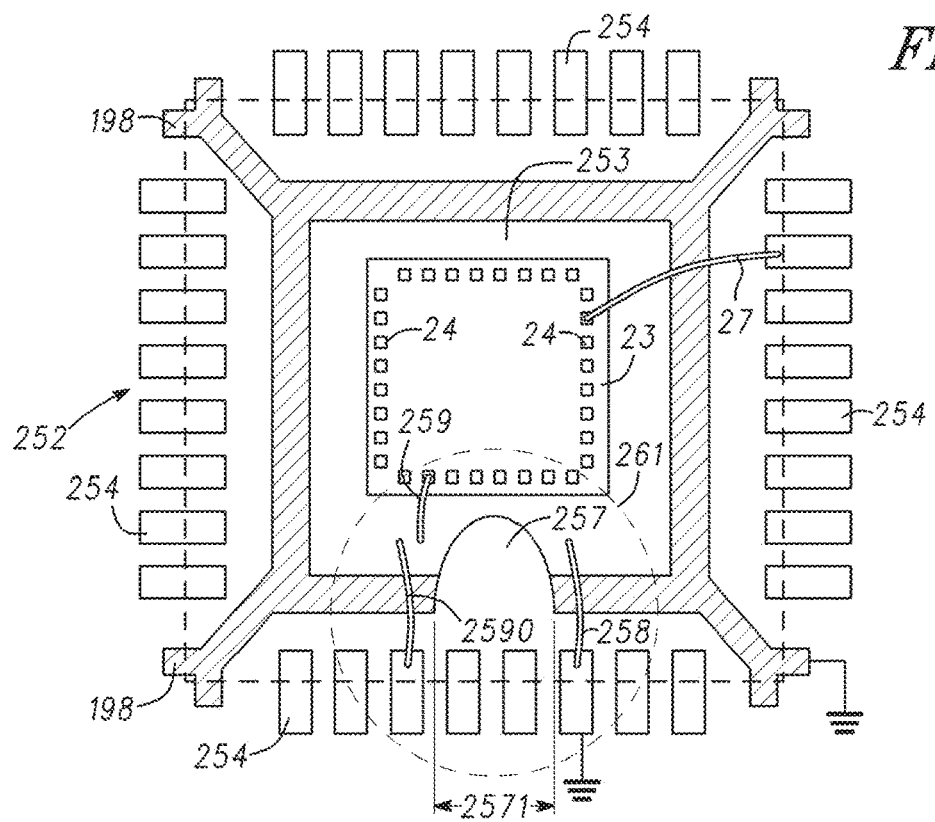
FIG. 26 illustrates a top view of an electronic device having an integrated antenna in accordance with another embodiment of the present invention.

FIG. 26 illustrates a top view of a packaged electronic device 260 or an electronic device 260 having an integrated antenna 261 in accordance with another embodiment of a Vivaldi antenna. Electronic device 260 is similar to electronic device 250, and only the differences will be described hereinafter. In accordance with the present embodiment, integrated antenna 261 further comprises a second conductive feed 2590 that electrically connects die pad 253 to one of leads 254. In some embodiments, second feed 2590 can be sourced or fed from a next level of assembly, such as a printed circuit board.

Figure 27:
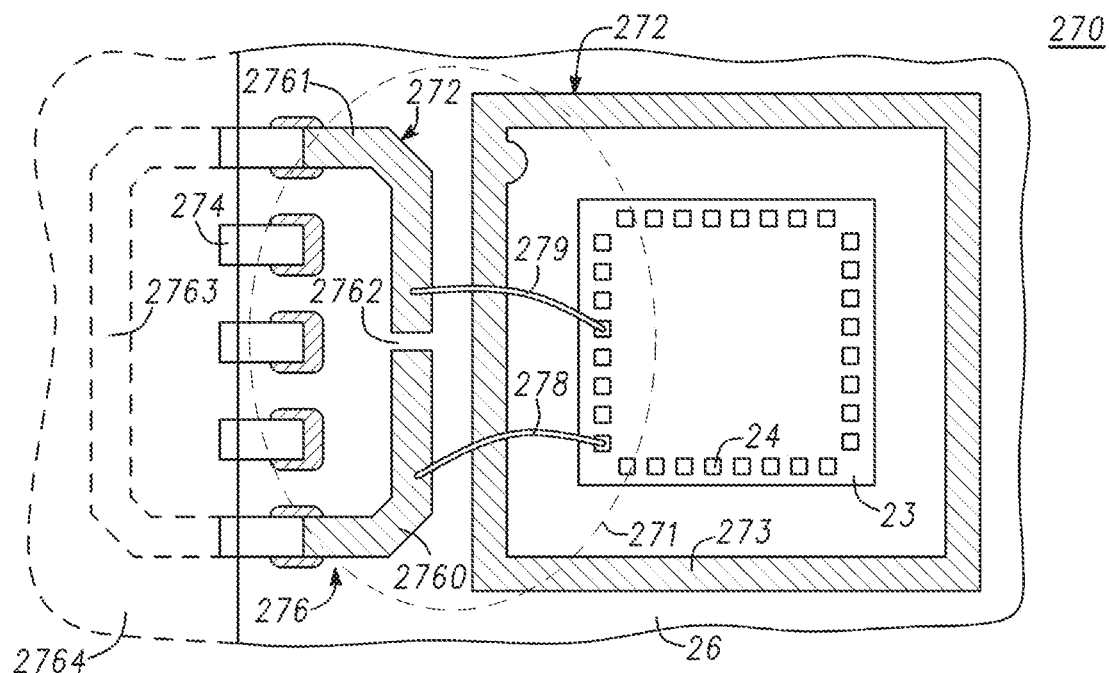
FIG. 27 illustrates a partial top view of an electronic device having an integrated antenna in accordance with an embodiment of the present invention.

FIG. 27 illustrates a partial top view of a packaged electronic device 270 or an electronic device 270 having an integrated antenna 271 in a first embodiment of a folded dipole antenna. In accordance with the present embodiment, the folded dipole antennas described hereinafter are configured so that the ends of the antenna structure fold back in a manner that places the source or feed adjacent to ground thereby forming a loop. The loop including closed loop construction of the antenna design is configured similar to parallel short circuited transmission lines, each having half the length of the total antenna length, with each transmission line separated by the feed placed at approximately the midpoint of the antenna loop. In accordance with the some embodiments, the length of the folded dipole antenna is much greater than its width. In view of the folded design, currents in the antenna reinforce each other instead of cancelling each other out.

The folded dipole antenna is resonant and radiates better at odd integer multiples of a half-wavelength. (e.g.—0.5λ. 1.5λ, 2.5λ, etc.). This is dependent upon the location of the feed and is the case, for example, when the feed is positioned in the center of the loop. Also, the folded dipole antenna can be tuned to resonate at even multiple of half-wavelengths. (e.g.—1.0λ, 2.0λ, 3.0λ, etc.). This may be accomplished, for example, by positioning the feed (source) off-set from the center point of the loop (e.g., closer to one of the folded ends of the loop). In this manner, the folded dipole can be extended to radiate at a broader frequency bandwidth to enhance the usefulness of the antenna design, improve efficiency, and increase effectiveness.

Electronic device 270 comprises a conductive substrate 272, such as a conductive leadframe 272 or leadframe 272. In one embodiment, leadframe 272 includes a die pad 273 and a plurality of leads 274 disposed along peripheral edges of die pad 273 (only one set of leads 274 is illustrated). In accordance with the present embodiment, leadframe 272 further includes a split loop structure 276, a two-piece elongated conductive body 276 or elongated conductive beam structure 276 having a ground portion 2760 and a feed portion 2761 separated by a gap or void 2762. In accordance with one embodiment, the remaining portion 2763 (shown in dashed outline) of split loop structure 276 can be disposed on a next level of assembly, such as a printed circuit board 2764. Integrated antenna 271 further comprises feed or source 279 that electrically connects, in one embodiment, feed portion 2761 to electronic component 23; and ground pin 278 or ground wire 278 that electrically connects electronic component 23 to ground portion 2670. In an alternative embodiment, feed portion 2761 can be electrically connected to another source through printed circuit board 2764. In accordance with the present embodiment, elongated conductive beam structure 2760 and 2761 is configured to have two opposing ends that terminate in conductive lead structures disposed along one edge of package body 26.

Figure 28:
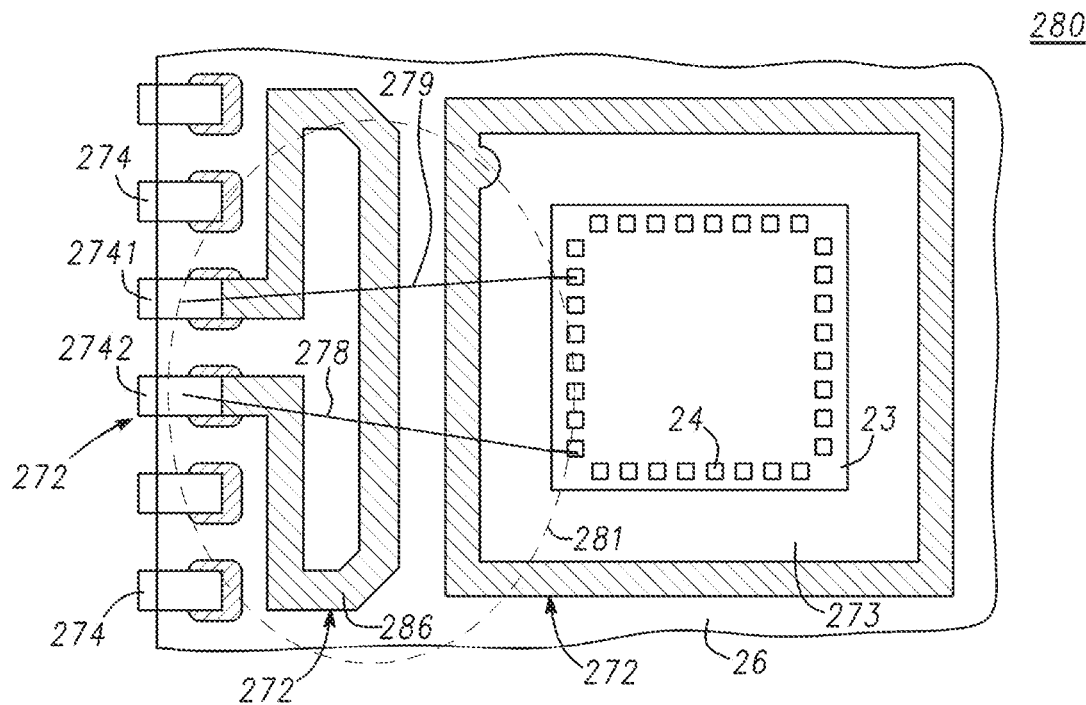
FIG. 28 illustrates a partial top view of an electronic device having an integrated antenna in accordance with another embodiment of the present invention.

FIG. 28 illustrates a partial top view of a packaged electronic device 280 or an electronic device 280 having an integrated antenna 281 in accordance with a second embodiment of a folded dipole antenna. Electronic device 280 is similar to electronic device 270, and only the differences will be described hereinafter. In the present embodiment, integrated antenna 281 comprises a split loop structure 286 or elongated conductive beam structure 286 configured as a fully integrated dipole antenna 281 encapsulated within package body 26. In one embodiment, split loop structure 286 includes a feed 2741 or a source lead 2741, which can either be fed from electronic component 23 through optional wire bond 279 or fed externally to electronic component 280; and a ground feed 2742 that can be fed through optional wire bond 278 or ground external to electronic device 280. In accordance with the present embodiment, two of the leads 274 (i.e., leads 2741 and 2742) of electronic device 280 function as the feed and ground for integrated antenna 281 respectively. In accordance with the present embodiment, elongated conductive beam structure 286 is configured to have two opposing ends that terminate in conductive lead structures 2741 and 2742 disposed along one edge of package body 26.

Figure 29:
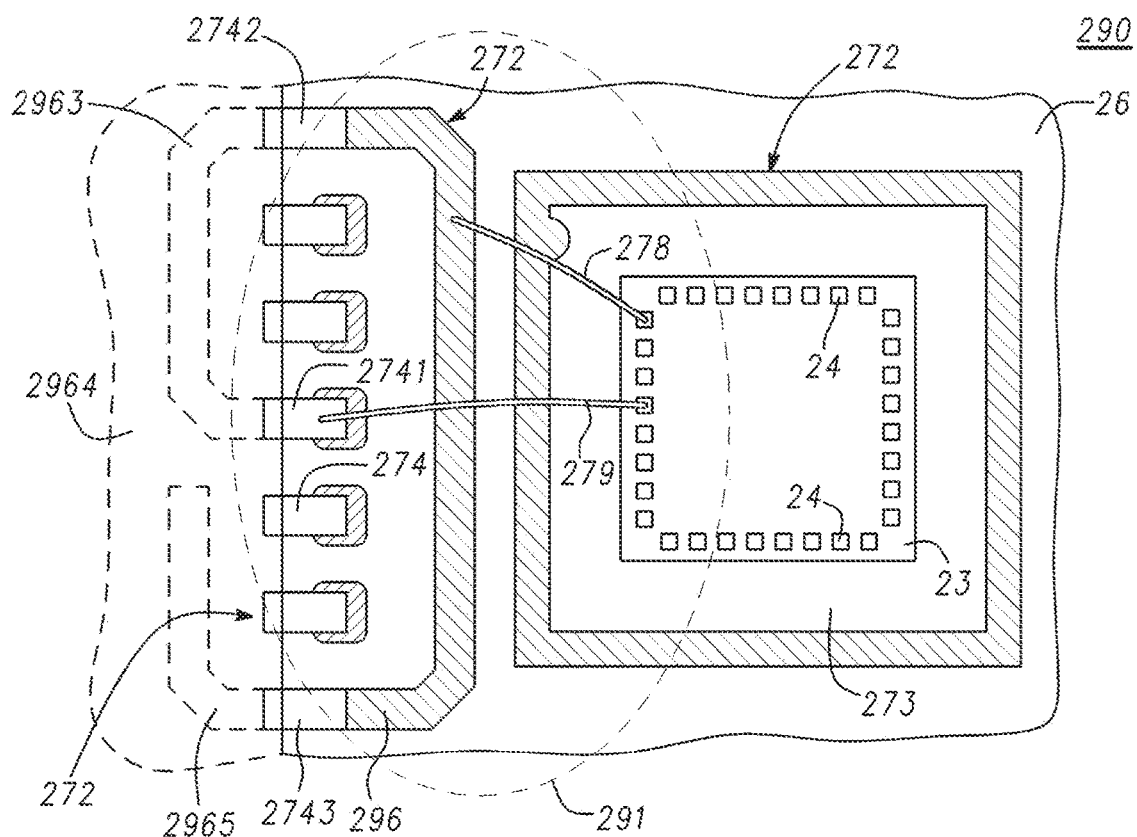
FIG. 29 illustrates a partial top view of an electronic device having an integrated antenna in accordance with a further embodiment of the present invention.

FIG. 29 illustrates a partial top view of a packaged electronic device 290 or electronic device 290 having an integrated antenna 291 in accordance with a further embodiment of a folded dipole antenna. Electronic device 290 is similar to electronic device 270 and only the differences will be discussed hereinafter. In the present embodiment, integrated antenna 291 comprises an elongated conductive beam structure 296 that forms one portion of the loop for the folded dipole antenna. More particularly, integrated antenna 291 offsets feed 2741 or source lead 2741 and ground lead 2742 for tuning purposes. In one embodiment, the split loop configuration can be with portions 2963 and 2965 within a printed circuit board 2964 in order to, for example, extend performance and improve the radiating and resonating behavior of integrated antenna 291. In accordance with the present embodiment, elongated conductive beam structure 296 is configured to have two opposing ends that terminate in conductive lead structures 2742 and 2743 disposed along one edge of package body 26.

Figure 30:
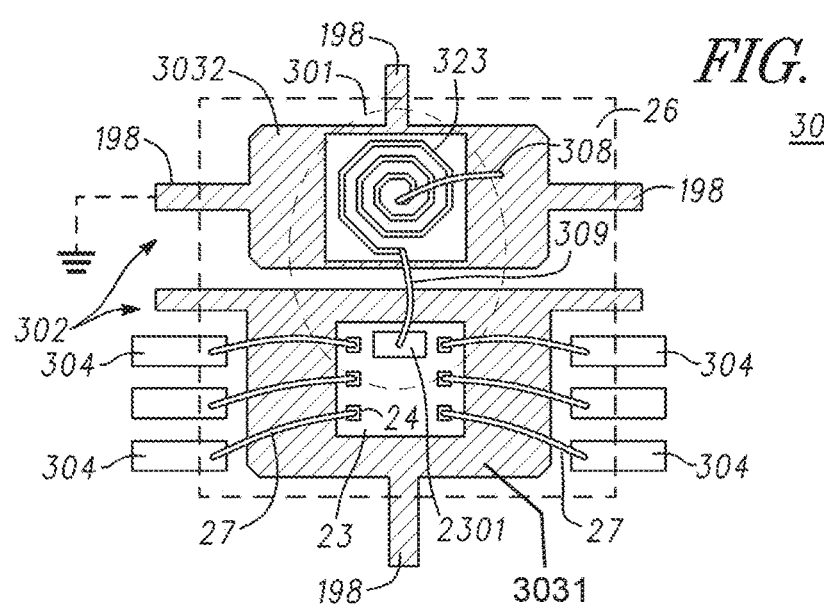
FIG. 30 illustrates a top view of an electronic device having an integrated antenna in accordance with an embodiment of the present invention.

FIG. 30 illustrates a top view of a packaged electronic device 300 or electronic device 300 having an integrated antenna 301 in accordance with another embodiment. In the present embodiment, integrated antenna 301 is configured as a spiral antenna embodiment. Electronic device 300 includes substrate 302, a conductive substrate 302, such as a conductive leadframe 302 or leadframe 302. In one embodiment, leadframe 302 includes a first die paddle 3031 or first die pad 3031, a second die paddle 3032 or second die pad 3032 and a plurality of leads 304 disposed spaced apart from at least first die pad 3031. It understood that electronic device 300 can have more or fewer leads 304 than illustrated. In the present embodiment, electronic component 23 is attached to first die pad 3031 and conductive connective structures 27, such as wire bonds 27 can be used to electrically connect bond pads 24 on electronic component 23 to leads 304. In one embodiment of electronic device 300, electronic component 23 is configured as a controller die, which can include, for example, logic, analog, and power functionality. In accordance in the present embodiment, electronic device 300 further comprises a spiral antenna device 323 attached to second die pad 3032, which is spaced apart from first die pad 3031 to isolate spiral antenna device 323 from electronic component 23. In accordance with one embodiment, spiral antenna device 323 can be manufactured as a separate component, such as an integrated passive device ("IPD").

In some embodiments, spiral antenna device 323 is configured with a back surface of metallization to enhance backplane grounding of spiral antenna device 323 for improved operational performance. In addition, the separated die pads 3031 and 3032 in accordance with the present embodiment have an advantage in that spiral antenna device 323 can be configured in multiple sizes and shapes depending on the application without impacting the size of electronic component 23 and its performance, and without requiring the use of expensive shielding techniques of electronic component 23. In accordance with the present embodiment, electronic component 23 is provided with a balun device 2301, which is electrically connected to one end of spiral antenna device with a feed 309 or source wire 309. An opposite end of spiral antenna device 323 is electrically connected to second die pad 3032 with ground pin 308 or grounding wire 308. Similar to other devices described herein, leadframe 302 can include one or more tie bars 198. It is understood that spiral antenna device 323 can have other shapes, including an octagon spiral shape, a hexagon spiral shape, a square spiral shape, a circular shape, and other shapes as known to those of ordinary skill in the art.

In one embodiment, spiral antenna device 323 can be formed using semiconductor deposition (e.g., electroplating) and patterning techniques (e.g., photolithographic and etch techniques). Integrated antenna 301 is suitable for applications where a wideband antenna or an antenna that operates within a broad frequency spectrum is required. In some embodiments, integrated antenna 301 is suitable for applications with operational frequencies between about 1 GHz to about 18 GHz. Examples of such applications include, but are not limited to, Bluetooth®, GPS, Zigbee, Z-Wave, RF tags, internet-of-things, or similar applications as known to those of ordinary skill the art.

Figure 31:
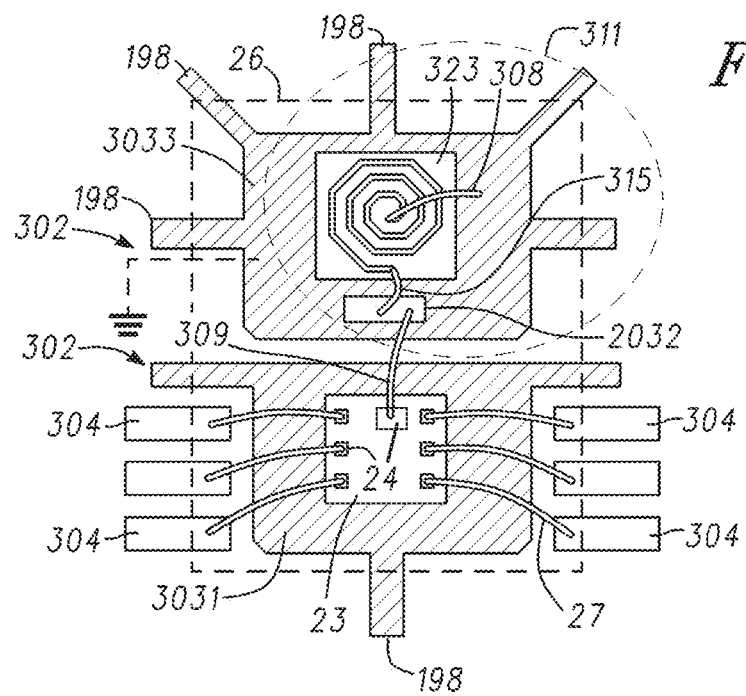
FIG. 31 illustrates a top view of an electronic device having an integrated antenna in accordance with another embodiment of the present invention.

FIG. 31 is a top view of a packaged electronic device 310 or electronic device 310 having an integrated antenna 311 in accordance with another embodiment. In the present embodiment, integrated antenna 311 is configured as another spiral antenna embodiment. Electronic device 310 is similar to electronic device 300 and only the differences will be described herein. In electronic device 310, leadframe 312 has a different die pad 3033 that is sized to accommodate a discrete balun device 2032 as well as spiral antenna device 323. In the present embodiment, source wire 309 electrically connects electronic component 23 to balun device 2032 and a conductive structure 315, such as a wire bond 315, electrically connects balun device 2031 to one end of spiral antenna device 323.

In an alternative embodiment, a balun device can be integrated within spiral antenna device 323, reducing the number of die in electronic device 310 and reducing the complexity of the system design and overall system cost. There may also be operational performance benefits derived from this configuration. As a standalone balun or integrated into the spiral antenna die, and located on an isolated die pad can have additional benefit by reducing signal loss, noise injection, and antenna impedance. This approach may provide improved performance, reduced power consumption, easier tuning, and improved overall system cost for some applications.

Figure 32:
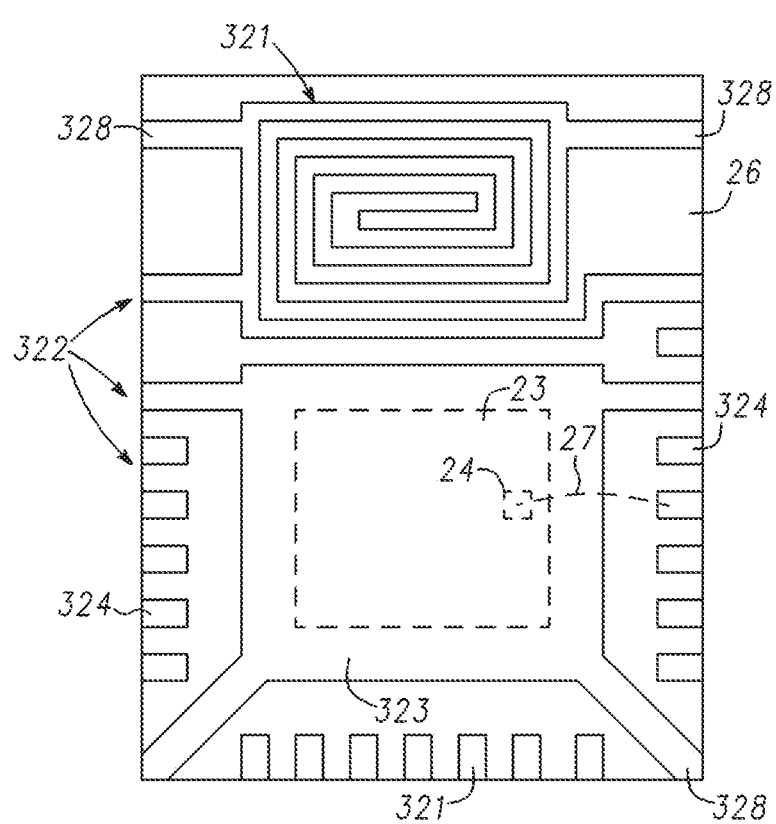
FIG. 32 illustrates a top view of electronic device having an integrated antenna in accordance with an embodiment of the present invention.
Figure 33:
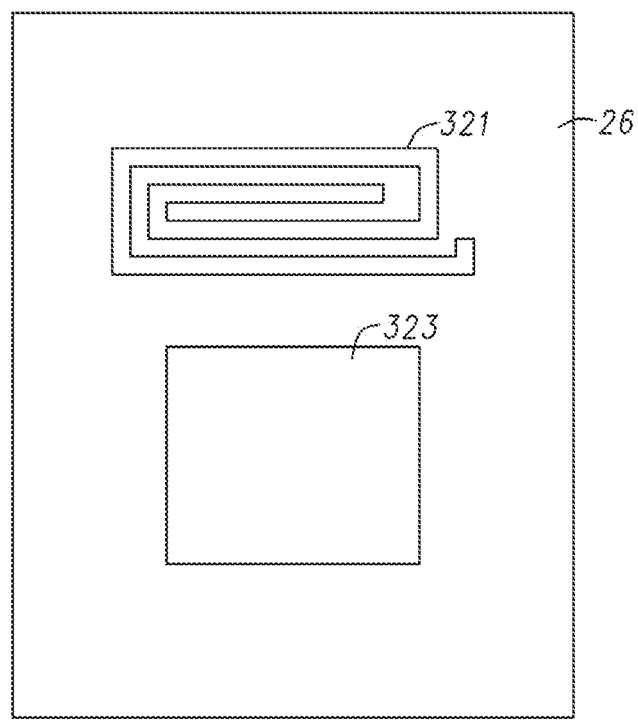
FIG. 33 illustrates another top view of the electronic device of FIG. 32.

FIG. 32 illustrates a top view of a packaged electronic device 320 or electronic device 320 having an integrated antenna 321 in accordance with another embodiment. In accordance with the present embodiment, integrated antenna 321 is another embodiment of a spiral antenna. Electronic device 320 comprises a substrate 322, a conductive substrate 322, conductive leadframe 322, or leadframe 322. In one embodiment, leadframe 322 includes a die paddle 323 or die pad 323, a plurality of leads 324 disposed spaced apart from at least some peripheral side surfaces of die pad 323, and one or more tie bars 328. It is understood that electronic device 320 can have more or fewer leads than illustrated. In the present embodiment, integrated antenna 321 comprises an elongated conductive beam structure, or elongated conductive body having a spiral shape, and is disposed within electronic package 320 spaced apart from die pad 323. In one embodiment, integrated antenna 321 is formed in the desired shape within leadframe 322 using etching and/or stamping techniques. In one embodiment, electronic device 320 comprises a top exposed pad structure with one surface of die pad 323 exposed through a major surface of package body 26 as generally illustrated in FIG. 33, which is a top view of electronic package 320. In one embodiment, integrated antenna 321 is further exposed through the same major surface of package body 26 similar to die pad 323. In other embodiments, die pad 323 can be encapsulated by package body 26 (i.e., not exposed in a major surface of package body 26) or exposed in an opposite major surface of package body 26 from the major surface where integrated antenna 321 is exposed. In other embodiments, the major surfaces of integrated antenna 321 can be fully encapsulated (i.e., not exposed in a major surface of package body 26) by package body 26.

In the present embodiment, electronic component 23 (shown in dashed line outline) is attached to surface of die pad 323 and encapsulated by (i.e. not exposed in) package body 26. Electronic component 23 can be electronically connected to leads 324 using conductive structures 27 as in previous embodiment and/or electrically connected to integrated antenna 321. In alternative embodiments, electrical connections to integrated antenna 321 can be made through a next level of assembly, such as a printed circuit board. In one embodiment, after the molding step to form package body 26, a removal step, such as a grinding step and/or an etching step, can be used to remove portions of the mold compound to expose a surface of die pad 323 and one or more surfaces of integrated antenna 321. As in previous embodiments, the materials used to form leadframe 322, the dimensions of leadframe 322, and the material properties of package body 26 are selected in accordance with specific antenna requirements.

Figure 34:
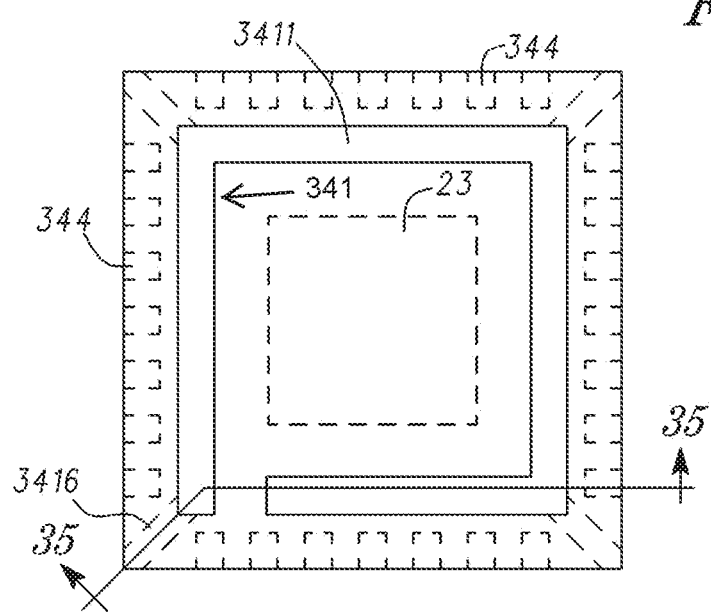
FIG. 34 illustrates a top view of electronic device having an integrated antenna in accordance with an embodiment of the present invention.

FIG. 34 is a top view of a packaged electronic device 340 or electronic device 340 with integrated antenna 341 in accordance with another embodiment. In accordance with the present embodiment, integrated antenna 341 includes a first elongated conductive beam structure 3411 or first elongated conductive body 3411 disposed on an outer surface of package body 26. As will be explained further in FIG. 35, electronic device 340 includes a plurality of leads 344 and electronic device 23, both illustrated in dashed lines in FIG. 34 based on the top view. In one embodiment, first elongated conductive body 3411 can be formed by depositing a conductive layer overlying a major surface of package body 26. In another embodiment, first elongated conductive body 3411 can a metal foil, a metal film, or metal structure attached or placed on the exterior surface of package body 26. In one embodiment, the conductive layer can be a metal, such a copper, a copper alloy, gold, multiple layers of metal, or other antenna materials as known to those of ordinary skill in the art. Thereafter, masking and etching techniques can be used to pattern first elongated conductive body 3411 into a desired pattern to provide first elongated conductive body 3411. In one embodiment, first elongated conductive body 3411 can be provided in the shape of a patch antenna, in the shape of a spiral antenna, other antenna shapes as described herein, or other similar shapes as known to those of ordinary skill in the art. In other embodiments, a masking layer is deposited and first elongated conductive body 3411 formed on portions of package body 26 not covered by the masking layer. The masking layer can then be removed, or in an alternative embodiment left in place and used as an insulating layer.

Figure 35:
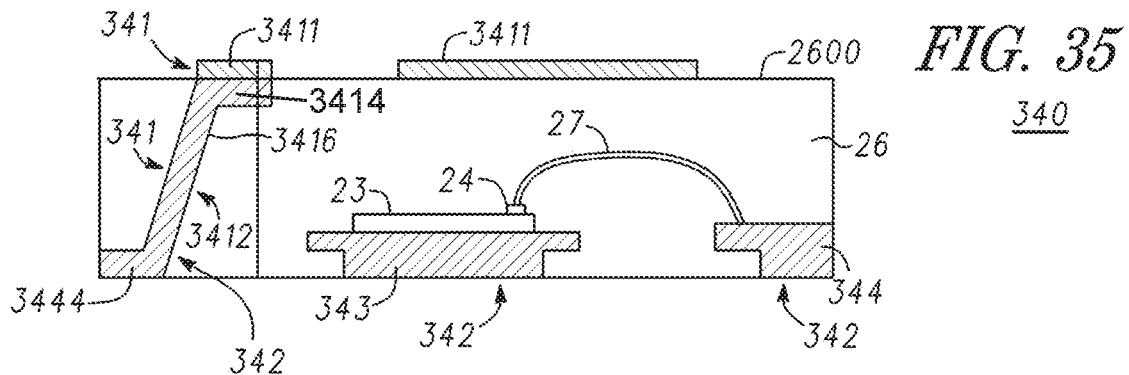
FIG. 35 illustrates a cross-sectional view of the electronic device of FIG. 34 taken along reference line 35-35.

FIG. 35 is a cross-sectional view of electronic device 340 taken along reference line 35-35 in FIG. 34. Electronic device 340 further comprises a substrate 342 or a conductive substrate 342, such a conductive leadframe 342 or leadframe 342. In one embodiment, leadframe 342 includes a die paddle 343 or die pad 343, a plurality of leads 344 disposed spaced apart from die pad 343, and a second elongated conductive beam structure 3412, second elongated conductive body 3412, or conductive antenna pillar structure 3412. In one embodiment, conductive antenna pillar structure 3412 comprises a lead portion 3444, which is on the same plane as leads 344, a contact portion 3414 for electrically connecting to first elongated conductive body 3411, and a connecting portion 3416 extending between lead portion 3444 and contact portion 3414. In one embodiment, conductive antenna pillar structure 3412 is exposed in at least two surfaces of package body 26, including major surface 2600 where first elongated conductive body 3411 is disposed.

In one embodiment, conductive antenna pillar structure 3412 can be configured as a transmission line for integrated antenna 341, and can be used to electrically connect integrated antenna 341 to a next level of assembly, such as a printed circuit board, or to electrically connect integrated antenna 341 to electronic component 23. In one embodiment, electronic component 23 is attached to die pad 323 and electrically connected to leads 344 using conductive connective structure 27, such as wire bond 27. In one embodiment, lower surfaces of lead portion 3444, die pad 323, and leads 344 are exposed in a lower surface of package body 26. In accordance with the present embodiment, integrated antenna 341 comprises first elongated conductive body 3411 and conductive antenna pillar structure 3412. In some embodiments, a protective layer can be provided overlying first elongated conductive body 3411.

Figure 36:
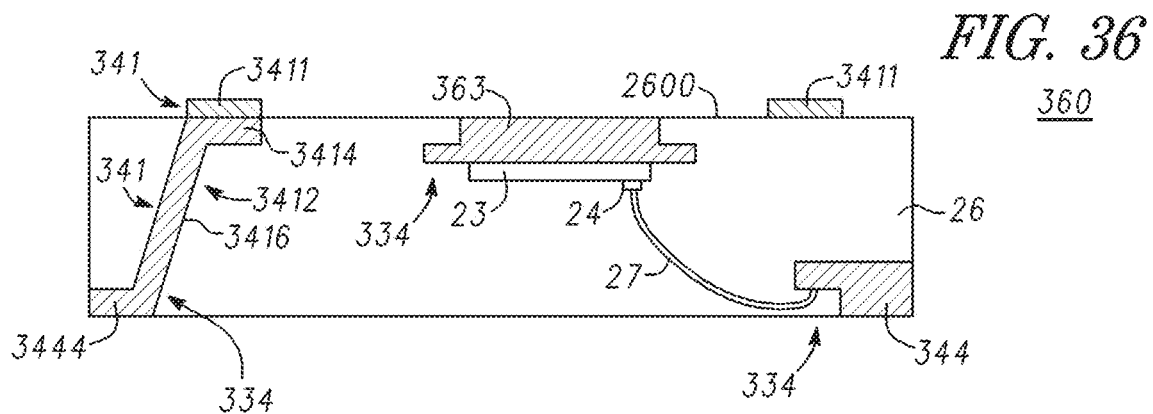
FIG. 36 illustrates a cross-sectional view of an electronic device having an integrated antenna in accordance with an embodiment of the present invention.

FIG. 36 is a cross-sectional view of a packaged electronic device 360 or an electronic device 360 having integrated antenna 341 in accordance with a further embodiment. Electronic device 360 is similar to electronic device 340 and only the differences will described herein. In accordance with the present embodiment, electronic device 360 is provided in a top-exposed-pad configuration with die pad 363 being disposed adjacent major surface 2600 of package body 26 and plurality of leads 344 being disposed on the opposite major surface of package body 26.

Figure 37:
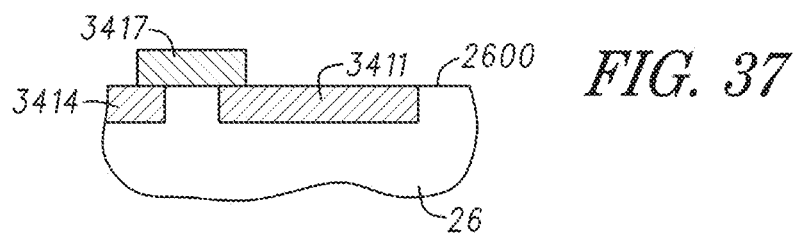
FIG. 37 illustrates a partial cross-sectional view of an embedded antenna in accordance with an embodiment of the present invention.

FIG. 37 is a partial cross-sectional view of package body 26 in an alternative embodiment to illustrate an embodiment where first elongated conductive body 3411 is embedded within package body 26. In one embodiment, the outer exposed surface of first elongated conductive body 3411 is substantially planar or substantially flush with major surface 2600 of package body 26. In one embodiment, after package body 26 is formed, the desired pattern for integrated antenna 341 can be etched into package body 26 and the etched pattern thereafter filled with a conductive material to form first elongated conductive body 3411. In one embodiment, planarization techniques can be used to remove portions of the conductive material to provide a co-planar configuration between package body 26 and first elongated conductive body portion 3411. First elongated conductive body 3411 can be directly connected to conductive pillar 3412 within package body 26, or by exposing contact portion 3414 in major surface 2600 of package body 26 and electrically connecting the two structures with a conductive connective bridge 3417.

Figure 38:
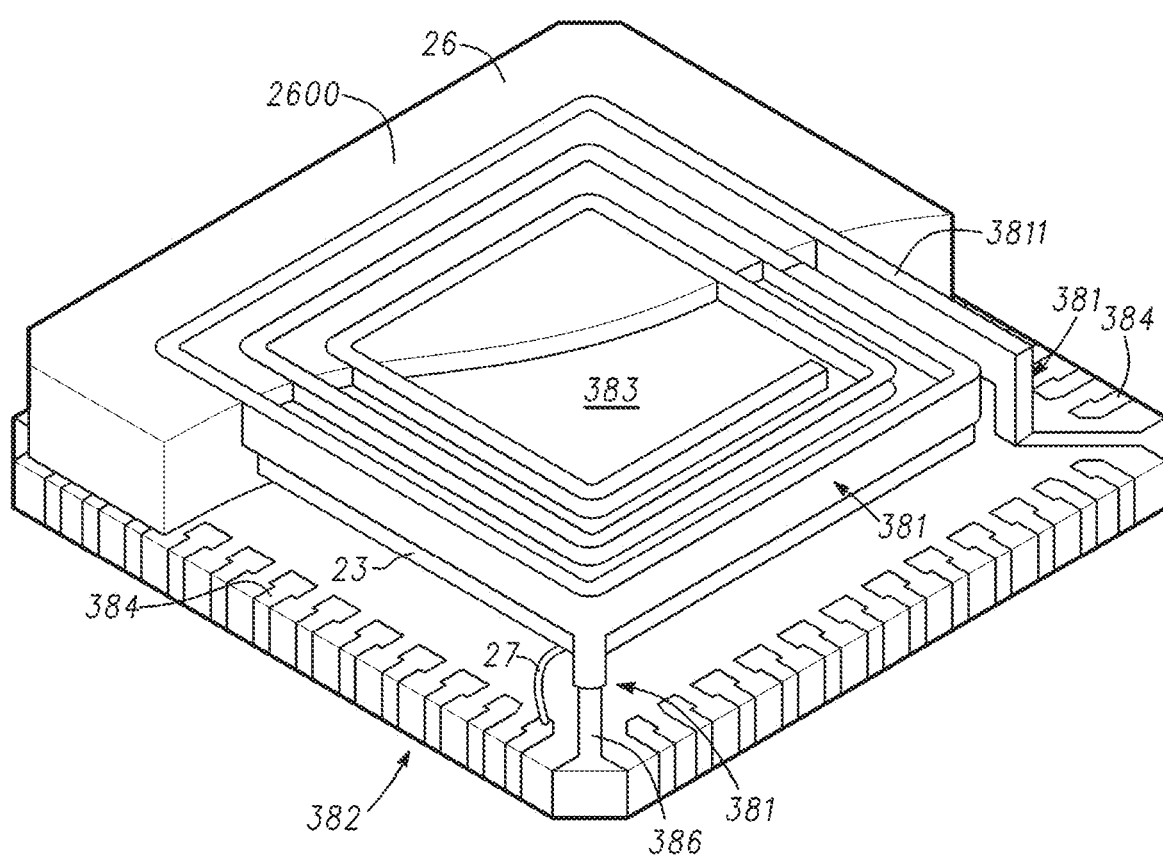
FIG. 38 illustrates a partial cut-away perspective top view of a packaged electronic device having an integrated antenna in accordance with another embodiment of the present invention.

FIG. 38 is a partial cut-away top perspective view of a packaged electronic device 380 or electronic device 380 having an integrated antenna 381 in accordance with another embodiment. In the present embodiment, integrated antenna 381 is configured in a spiral antenna shape and is an example embodiment of an integrated antenna embedded in the molded package body, such as package body 26. In one embodiment, electronic device 380 comprises a substrate, such as s conductive substrate 382, conductive leadframe 382, or leadframe 382. In one embodiment, leadframe 382 includes a die paddle 383 or a die pad 383, a plurality of leads 384 disposed spaced apart from die pad 383, and one or more conductive pillar structures 386 that extend from one major surface of package body 26 to an opposite major surface and can be integral with die pad 383. In accordance with the present embodiment, conductive pillar structures 386 are configured to both support die pad 383 (for example, during assembly) and to provide electrical communication with integrated antenna 381. In one embodiment, electronic device 380 further comprises electronic component 23 attached to an opposing surface of die pad 383 that faces leads 384. Electronic component 23 can be electrically connected to leads 384 using conductive connective structures 27, such as wire bonds 27 as described previously.

In one embodiment, an insulative layer (not shown) can be disposed on a major surface of die pad 383 and antenna portion 3811 or spiral antenna portion 3811 can be formed on the insulative layer, using for example, deposition, masking, and etching techniques. After package body 26 is formed, portions of package body 26 can be removed to form major surface 2600 and exposes a portion of antenna portion 3811 in major surface 2600. By way of example, grinding, polishing, and/or etching techniques can be used to remove portions of package body 26. In accordance with the present embodiment, integrated antenna 381 can include antenna portion 3811, one or more conductive pillar structures 386, and die pad 383.

In alternative embodiment, a second die pad can be used to support electronic component 23 on the same major surface of package body 26 as leads 384. In one embodiment, antenna portion 3811 is exposed in major surface 2600 of package body 26 and the second die pad can be exposed in the opposing major surface of package body 26. In a further embodiment, antenna portion 3811 can be formed after package body 26 is formed by removing portions of package body 26 in a desired groove pattern and then filling the groove pattern with a conductive material to antenna portion 3811. Removal techniques, such as grinding and/or etching techniques, can be used to remove portions of the conductive material so that, in one embodiment, the upper surface of antenna portion 3811 and surface 2600 of package body 2600 are substantially co-planar or flush with each other. In one embodiment, antenna portion 3811 is formed to electrically connect to one more of conductive pillars 386.

Turning now to FIGS. 39-46, various embodiments of substrate structures are described having locking features configured to improve the adhesion between mold materials, such as epoxy mold compounds and the substrate structures. In the following description, the substrate structures are illustrated and described using conductive leadframe substrate structures, but it is understood that the features and elements described are relevant to other types of substrate structures and are not just limited to leadframe type substrate. The following embodiments can be used in combination with any of the integrated antenna structures described herein, or can be used in packaged electronic devices that do not include integrated antennas.

In accordance with the present embodiments, the locking features are disposed entirely through selected parts of the leadframe (i.e. extending from one surface to another surface to enable the molding material to flow through these areas. In one preferred embodiment, the locking features are disposed in portions of the substrate structure that are reduced in thickness compared to other portions of the substrate structure. In some embodiments, the portions having reduced thickness are prepared using removal techniques, such as etching techniques.

In accordance with the present embodiments, the locking features can vary in size, shape, number, spacing, and location within the specific substrate structure. These variables can depend on several design constraints including, but not limited to, the presence of down bonds, the ratio of semiconductor chip size to die attach pad size, size of the package body, the material type and thickness of the substrate, lead pitch, tie bar design and location, and the properties of the mold compound used for molding. By way of example, the filler size in a mold compound is selected such that the mold compound can flow through the locking features during molding, which will determine at least in part how secure the interface will be between the mold compound and the substrate structure.

Figure 39:
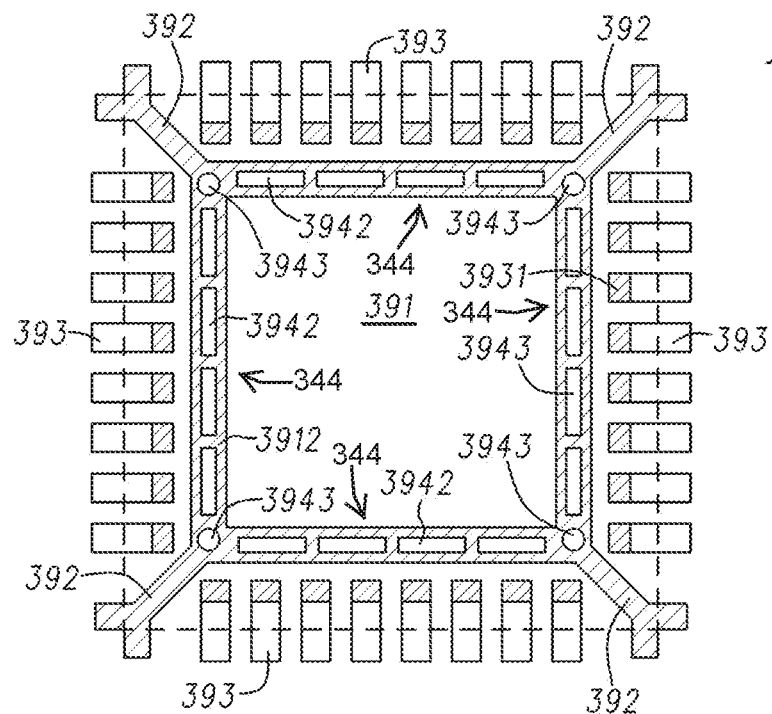
FIG. 39 illustrates a bottom view of a substrate structure in accordance with an embodiment of the present invention.
Figure 40:
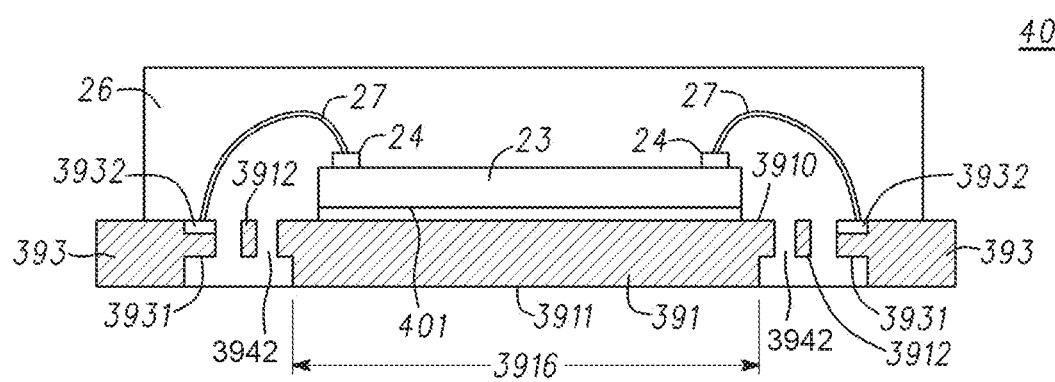
FIG. 40 is cross-sectional view of the substrate structure of FIG. 39.

FIG. 39 illustrates a bottom view of a substrate structure 390, such as a leadframe 390 in accordance with a first embodiment. FIG. 40 illustrates a cross-sectional view of leadframe 390 incorporated into an electronic packaged device 400. In one embodiment, leadframe 390 comprises a generally quadrangular (e.g., square) die pad 391 or die paddle 391, which defines four peripheral edge segments. Additionally, when viewed from the cross-section illustrated in FIG. 40, die pad 391 defines opposed, generally planar upper and lower surfaces 3910 and 3911 respectively. As evident in FIG. 40, die pad 391 is not of uniform thickness. Rather, a peripheral portion of lower surface 3911 is partially removed or partially etched (e.g., half-etched) to define an etched portion 3912. Etched portion 3912 is further illustrated in FIG. 39 by the condensed hatching that slopes downward from right to left. In some embodiments, etched portion 3912, which is recessed relative to the remainder of lower surface 3911 of die pad 391, extends completely around the peripheral edge segments of die pad 391.

In one embodiment, leadframe 390 further comprises a plurality of tie bars 392 integrally connected to die pad 391. In one embodiment, leadframe 390 includes four tie bars 392 extending generally diagonally from respective ones of four corner regions defined by die pad 391 to a dam bar (not shown), which effectively support die pad 391 during the fabrication of electronic package device 400. In some embodiments, tie bars 392 have a reduced thickness similarly to etched portion 3912. Leadframe 390 further comprises a plurality of leads 393 disposed spaced apart from die pad 391, and, in one embodiment, comprise four sets disposed along each of the four peripheral edge segments of die pad 391. In some embodiments, the thickness of each lead 393 is not uniform with a peripheral portion 3931 being half-etched. In some embodiments, the upper surfaces of leads 393 can include a wirebond pad or portion 3932 as illustrated in FIG. 40.

In accordance with the present embodiment, leadframe 390 further comprises a plurality of locking features 394 disposed in selected portion of leadframe 390. In one embodiment, locking features 394 comprise slots 3941 or locking slots 3941 disposed in etched portion 3912 of die pad 391 and circular holes 3942 or locking holes 3942 disposed proximate to where tie bars 392 and die pad 391 intersect, join, or meet. In accordance with the present embodiment, slots 3941 and circular holes 3942 are disposed completely through the respective locations within leadframe 390. In some embodiments, slots 3941 comprise elongated rectangular shapes spaced apart along peripheral edge segments of die pad 391. In one embodiment, at least four slots 3941 are disposed along each peripheral edge segment of die pad 391, and at least one circular hole 392 is disposed proximate to each corner portion of die pad 391. In accordance with the present embodiment, slots 3941 and circular holes 3942 are sized such that the filler within the selected mold compound used to form package body 26 fits within them, and to allow the mold compound to flow through them during the molding process. This configuration provides enhanced adhesion between leadframe 391 and package body 26.

Packaged electronic device 400 further comprises electronic component 23 attached to upper surface 3910 of die pad 391 using, for example, an attachment layer 401. Conductive connective structures 27, such as wirebonds 27, electrically connect bond pads 24 on an upper surface of electronic component 23 to wirebond portions 3932 on leads 393. Package body 26 encapsulates electronic components 23, conductive connective structures 27, portions of leads 393, and portions of die pad 391. In one embodiment an exterior surface 3916 of die pad 391 and portions of leads 393 are exposed through lower surface of package body 26. In accordance with the present embodiment, etched portion 3912 having slots 3942 and circular holes 3943 and tie bars 392 are encapsulated within package body 26.

Figure 41:
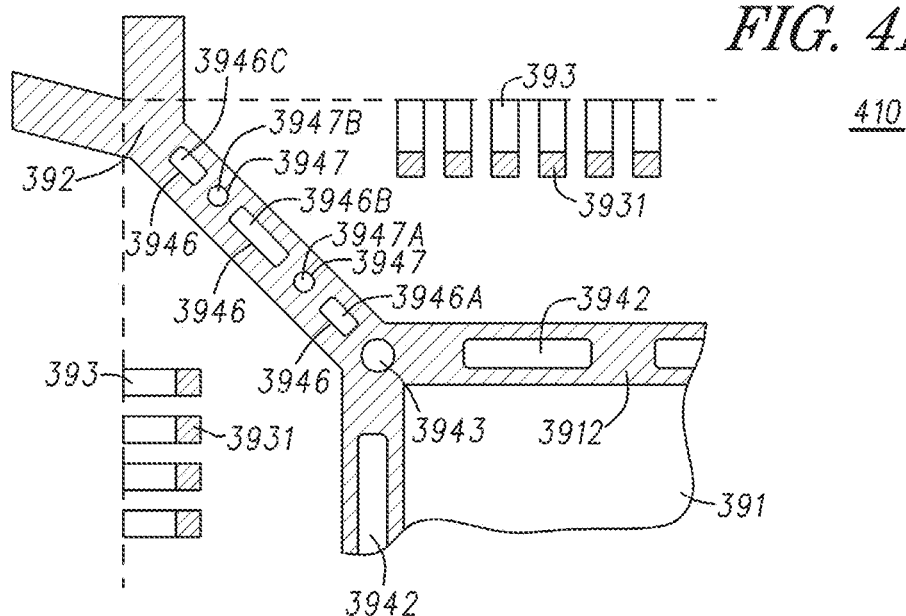
FIG. 41 illustrates a partial bottom view of a portion of a substrate structure in accordance with another embodiment of the present invention.

FIG. 41 illustrates a partial bottom view of a substrate structure 410 or leadframe 410 in accordance with another embodiment. Leadframe 410 is similar to leadframe 390, and only the differences will be described hereinafter. In accordance with the present embodiment, leadframe 410 further comprises additional locking features including a plurality of tie bar slots 3946 and one or more tie bar circular holes 3947 disposed within one or more tie bars 392. In one preferred embodiment, each tie bars 392 is configured with tie bar slots 3946 and one more tie bar circular holes 3947. In one embodiment, a first tie bar slot 3946A is disposed adjacent circular hole 3943 and a first tie bar circular hole 3947A is disposed between a distal end of tie bar 392 and first tie bar slot 3946A. In one embodiment, a second tie bar slot 3946B is disposed between the distal end and first tire bar circular hole 3947A. In one embodiment, a second tie bar circular hole 3947B is disposed between the distal end and second tie bar slot 3946B. In one embodiment, a third tie bar slot 3946C is disposed between the distal end and second tie bar circular hole 3947B. In one embodiment, second tie bar slot 3946B can be longer than one or more of first tie bar slot 3946A and third tie bar slot 3946C. It is understood that in other embodiments, more or less tie bar circular holes and/or tie bar slots can be used, and that different tie bar slot shapes may be used.

Figure 42:
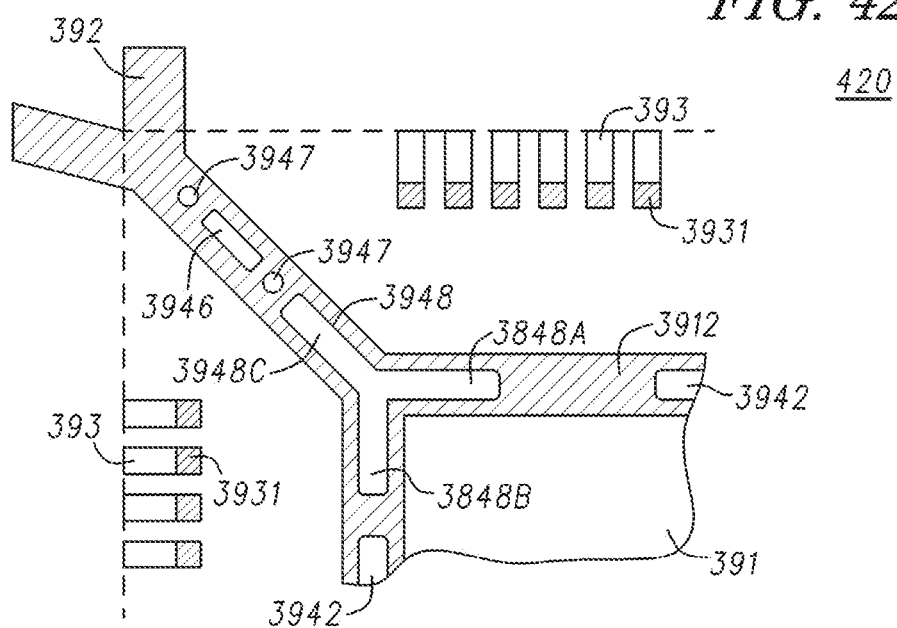
FIG. 42 illustrates a partial bottom view of a portion of a substrate structure in accordance with a further embodiment of the present invention.

FIG. 42 illustrates a partial bottom view of a substrate structure 420 or leadframe 420 in accordance with a further embodiment. Leadframe 420 is similar to leadframe 390 and 410 and only the differences will be described hereinafter. In accordance with the present embodiment, leadframe 410 comprises a Y-shaped slot structure 3948 disposed in that portion of leadframe 410 where tie bar 392 intersects with a corner portion of die pad 391. In accordance with the present embodiment, Y-shaped slot structure 3948 is disposed within etched portion 3912 of die pad 391 and along part of the half-etched portion of tie bar 392. In one embodiment, two slots 3948A and 3948B are disposed extending completely through etched portion 3912 and third slot 3948C is disposed extending completely through tie bar 392. Stated another way, the V-shaped portion defined by slots 3948A and 3948B of Y-shaped slot structure 3948 are disposed primarily in etched portion 3912, and the I-shaped portion defined by slot 3948C of Y-shaped slot structure 3948 is disposed primarily in tie bar 392. In some embodiments, tie bar 392 can include one or more tie bar slots 3946 and one or more tie bar circular holes 3947. In one preferred embodiment, each corner portion of die pad 391 and each tie bar 392 are configured similarly. In accordance with the present embodiment, Y-shaped slot structure 3948 advantageously provide enhanced adhesion between package body 26 and leadframe 420, it is also configured to interlock tie bar 392 and etched portion 3912 to provide improved stability and strength in areas of high stress, particularly in large body devices. This particular embodiment is advantageous, for example, in package devices using thicker leadframes (e.g., ≥about 200 microns (≥8 mils) and application that utilize them, such as high thermal devices. Y-shaped slot structures 3948 reduce the amount of metal mass in the corner portions of die pad 391, which reduces the coefficient of thermal expansion ("CTE"). This together with the interlocking of the mold compound and the tie bar/die pad region reduces warping that may occur during molding or post mold cure process.

Figure 43:
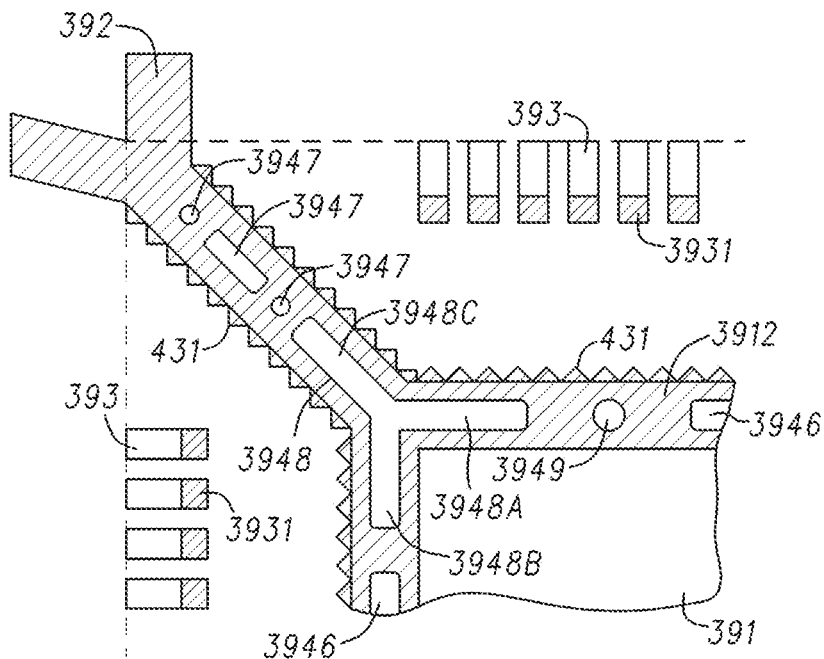
FIG. 43 illustrates a partial bottom view of a portion of a substrate structure in accordance with another embodiment of the present invention.

FIG. 43 illustrates a partial bottom view of a substrate structure 430 or leadframe 430 in accordance with another embodiment. Leadframe 430 is similar to leadframes 390, 410, and 420 and only the differences will be described hereinafter. Further, it is understood that the features of leadframe 430 can be used in combination with the other embodiments described herein as well as others. Leadframe 430 comprises the application of an edge 431 having a non-linear shape to etched portion 3912 of die pad 391 and to tie bars 392. In one embodiment, edge 431 comprises wavy-shaped edge, including a serrated edge, a saw-tooth edge, a rounded-wave edge, or an edge configured to increase the surface area of edge portions of die pad 391 and tie bars 392. This increase in surface area increases the effectiveness of the mold compound adhesion to leadframe 430. Edge 431 having a non-linear shape can be used alone, or in combinations with one or more of the locking features described herein. Also, edge 431 can be placed on less than all of the peripheral edge segments of die pad 391. In one embodiment, etched portion 3912 can further include one or more circular hole 3949 locking features disposed completely through etched portion 3912 and disposed at selected locations of etched portion 3912. In one embodiment, circular hole 3949 can be disposed between two slots 3946, or disposed between Y-shaped slot structure 3948 and a slot 3946.

Figure 44:
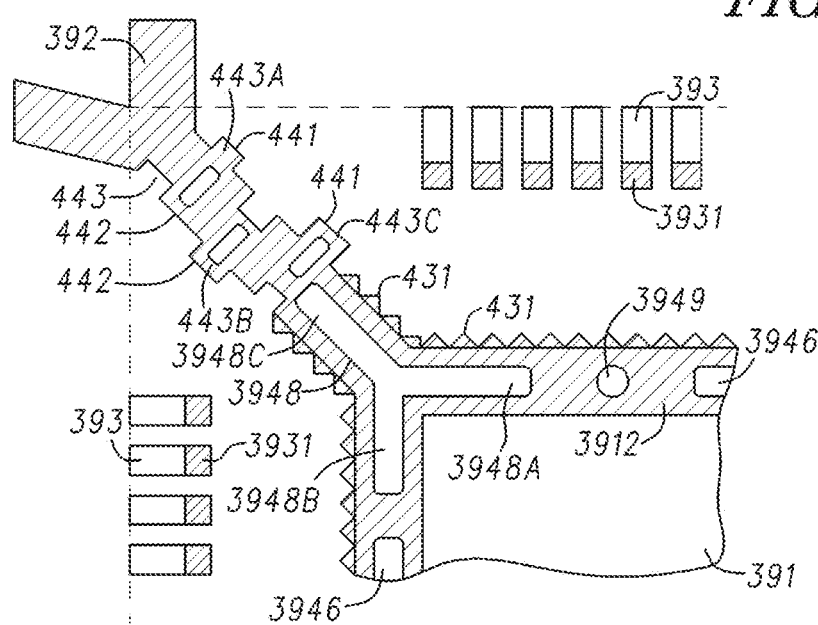
FIG. 44 illustrates a partial bottom view of a portion of a substrate structure in accordance with a further embodiment of the present invention.

FIG. 44 illustrates a partial bottom view of a substrate structure 440 or leadframe 440 in accordance with a further embodiment. Leadframe 440 is similar to leadframes 390, 410, 420, and 430 and only the differences will be described hereinafter. In accordance with the present embodiment, leadframe 440 comprises edges 441 and 442 that are non-linear to provide an offset slotted tab locking structure 443. In one embodiment, edge 442 has a different shape or edge profile than edge 441. In one embodiment, locking structure 443 comprises a plurality of tabs 443A, 443B, and 443C that are offset from each other in a non-contiguous manner. The sizes and shapes of tabs 443A, 443B, and 443C can vary. In one embodiment, each tab includes a slot 444 disposed completely through its respective slot. In some embodiments, slots 444 are disposed generally perpendicular to slot 3948C when Y-shaped slot structure 3948 is also included. In another embodiment, locking structure 443 and can further be disposed along peripheral edge segments of die pad 391. Similarly to edge 431, locking structure 443 is configured to increase the surface area of leadframe 440 thereby improving the adhesion between leadframe 440 and the molding compound used to form package 26.

From all of the foregoing, one skilled in the art can determine that in accordance with one embodiment, a packaged electronic device comprises a leadframe having a die pad, at least one tie bar integral with the die pad, and a plurality of leads disposed spaced apart from the die pad. An electronic component is electrically connected to the leads. The die pad includes an etched portion around at least a portion of peripheral edge segments. A first plurality of locking features is disposed extending through the etched portion. A molded package body encapsulates the electronic components and portions of the leadframe and is disposed within the locking features.

In one embodiment, the first plurality of locking features comprises an edge have a non-linear provide disposed circumventing at least a portion of the etched portion. In another embodiment, the first plurality of locking features comprises slots. In a further embodiment, the first plurality of locking features comprises circular holes. In another embodiment, first plurality of locking features can comprise offset slotted tabs. In another embodiment, a second plurality of locking features is disposed extending through the tie bar. In one embodiment, the second plurality of locking features comprises an edge having a non-linear provide disposed along edge portions of the tie bar. In another embodiment, the second plurality of locking features comprises slots. In a further embodiment, the second plurality of locking features comprises circular holes. In another embodiment, the second plurality of locking features can comprise offset slotted tabs.

The locking features described above, including in particular locking features 431, resulted in packaged electronic devices that met Moisture Sensitivity Level 1 ("MSL 1") requirements. This is advantageous because passing MSL 1 testing allows manufacturers to eliminate costly precautionary processing, such backing processes and dry pack storage. This also eliminates the need to monitor the shelf life of package electronic components using the embodiment herein even after the dry pack is opened. In comparison, a packaged electronic device that does not pass the MSL 1 requirement must be used in a certain amount of time before additional baking processes must be used.

From all of the foregoing, one skilled in the art can determine that in accordance with one embodiment, a method of making an electronic packaged device having an integrated antenna comprises a providing conductive substrate comprising: a first conductive die attach pad, a first conductive lead spaced apart from a first side of the first conductive die attach pad, and an elongated conductive beam structure disposed proximate to the first side of the first conductive die attach pad, the elongated conductive beam structure electrically coupled one or more of first conductive die attach pad and the electronic device, wherein the elongated conductive beam structure and one or more of the first conductive die attach pad and a second conductive lead are configured as an antenna structure. The method includes coupling an electronic device to the first conductive lead, and forming a package body encapsulating the electronic device and encapsulating at least portions of the first conductive die attach pad, at least portions of the first lead, and at least portions of the elongated conductive beam structure.

In view of all of the above, it is evident that novel packaged electronic devices with integrated antenna structures have been disclosed. Included, among other features, are electronic devices including conductive leadframes that uniquely incorporate one or more of the features described herein including, but not limited to, transmission line elements, ground plane elements, ground ring elements, patch elements, grounding elements, sourcing elements, wave guide elements, elongated conductive beam elements, conductive pillar elements, slot elements, conductive spiral elements, tuning elements, isolating elements, embedded package body elements with other components to provided integrated antenna structures. Some of these elements are advantageously included within conductive leadframe structures with other leadframe components to simplify integration. The elements and embodiments thereof described herein uniquely enables integrated antenna structures within electronic device packages, which provides the unexpected advantages of placing the antenna close to electronic chips thereby improving performance, enabling optimal resonance, reducing signal losses and, thus, improving radiation, reducing noise injection, reducing operational impedance, reducing power consumption. Additionally, it was unexpectedly found that using the capacitance of the mold material used for the package body can used as a way to load an antenna element. Further, the structures described herein utilize available fabrication processes, which save capital investment and other manufacturing costs. Finally, the integrated antenna embodiments described herein provide increased functionality in a small footprint and eliminate the need for external discrete antennas in certain applications, which supports current and future user demands.

Further in view of above, it is evident that novel locking structures have been disclosed. Included among other features are slotted, circular, tabular, and irregular edged locking structures are disposed in selected portions of leadframe elements to improve the adhesion of molding compounds to the leadframe, to reduce unwanted movement of leadframe elements, and to reduce warpage of leadframe elements.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, the structures and elements described herein can be used with substrates including laminate substrates and other substrates that having a die attach pad and use molded body structures. Although the present description primarily used a QFN/MLF or QFP leadframe substrate in the described embodiments, it is understood that the disclosed elements and concepts to can be applied other leadframe devices having a die attach pad. These other embodiments include, but are not limited to: DFN, SOC, SOIC, QFP, aQFN, tsCSP, GQFN, DR-MLF, etc. type electronic packages.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A packaged electronic device having an integrated antenna comprising:
    a lead frame comprising:
        a conductive die attach pad;
        conductive leads spaced apart from a first side of the conductive die attach pad; and
        an elongated conductive body configured as a u-shaped member with an open portion of the u-shaped member disposed facing opposite to the conductive die attach pad and having a first bonding portion disposed at a first end and second bonding portion disposed at an opposing second end, wherein a first conductive lead is disposed within the open portion defined by the u-shaped member so that the elongated conductive body partially encloses the first conductive lead;
    a conductive probe feed structure electrically coupled to the first conductive lead and the conductive die attach pad;

a conductive shorting structure electrically coupled to the elongated conductive body and the conductive die attach pad;

an electronic device disposed adjacent the conductive die attach pad; and a package body encapsulating the electronic device, the conductive probe feed structure, the conductive shorting structure, at least portions of the conductive die attach pad, at least portions of the conductive leads, and at least a portion of the elongated conductive body, wherein:

the integrated antenna comprises the conductive die attach pad, the first lead, the elongated conductive body, the conductive probe feed structure, and the conductive shorting structure.

2. The device of claim 1, wherein the elongated conductive body has a length greater than or equal to a width of the die attach pad.

3. The device of claim 1, wherein:

the elongated conductive body comprises a middle portion disposed between the first bonding portion and the second bonding portion that is thinner than the first bonding portion and the second bonding portion; and the package body encapsulates the middle portion.

4. The device of claim 1, wherein:

the elongated conductive body partially encloses more than one of the conductive leads; and the first conductive lead is disposed as a closest lead to the first bonding portion; and the conductive shorting structure is disposed closer to the first bonding portion than the second bonding portion.

5. The device of claim 1, wherein:

the first conductive lead is the only conductive lead partially enclosed by the elongated conductive body; and the conductive shorting structure is disposed closer to the second bonding portion than the first bonding portion.

6. The device of claim 1, further comprising:

a passive component electrically coupled to the elongated conductive body and the conductive die attach pad.

7. The device of claim 6, wherein:

the passive component is disposed closer to the second bonding portion than the first bonding portion; and the conductive shorting structure is interposed between the first bonding portion and the passive component in a top view.

8. The device of claim 6, wherein the passive component comprises a capacitor.

9. The device of claim 8, wherein the capacitor comprises a capacitance in a range from about 2 picofarads to about 100 picofarads.

10. The device of claim 7, wherein the conductive probe feed structure is interposed between the conductive shorting structure and the passive component in the top view.

11. The device of claim 1 further comprising a passive component electrically coupled to a second conductive lead and the conductive die attach pad.

12. The device of claim 11, wherein:

the second conductive lead is not partially enclosed by the elongated conductive body; and a third conductive lead is interposed between the second conductive lead and the elongated conductive body in a top view.

13. The device of claim 1, wherein the first bonding portion and the second bonding portion are disposed along the first side of the conductive die attach pad and exposed outside of the package body.

14. A packaged electronic device having an integrated antenna comprising:

a substrate structure comprising:

a conductive die attach pad;

conductive leads spaced apart from a first side of the conductive die attach pad; and an elongated conductive body having a first bonding portion disposed at a first end and second bonding portion disposed at an opposing second end, wherein:

the elongated conductive body is interposed between the first side of the conductive die attach pad and the conductive leads; and the first bonding portion, the second bonding portion, and the conductive leads terminate along an edge of the packaged electronic device;

an electronic device disposed adjacent the conductive die attach pad; and a package body encapsulating the electronic device, at least portions of the conductive die attach pad, at least portions of the conductive leads, and at least a portion of the elongated conductive body, wherein:

the integrated antenna comprises the elongated conductive body.

15. The device of claim 14, wherein:

the elongated conductive body is configured as a u-shaped member with an open portion of the u-shaped member disposed facing opposite to the conductive die attach pad;

a first conductive lead is disposed within the open portion defined by the u-shaped member so that the elongated conductive body partially encloses the first conductive lead; and the conductive die attach pad, the at least one lead, the elongated conductive body, the conductive probe feed structure, and the conductive shorting structure are configured as the integrated antenna; and the device further comprises:

a conductive probe feed structure electrically coupled to the first conductive lead and the conductive die attach pad; and a conductive shorting structure electrically coupled to the elongated conductive body and the conductive die attach pad.

16. The device of claim 15, wherein:

the elongated conductive body partially encloses more than one of the conductive leads; and the first conductive lead is disposed as a closest lead to the first bonding portion; and the conductive shorting structure is disposed closer to the first bonding portion than the second bonding portion.

17. The device of claim 14, wherein:

the elongated body portion comprises a ground portion and a feed portion separated by a gap;

the device further comprises:

a conductive feed structure electrically coupled to the feed portion and the electronic device; and a conductive ground structure electrically coupled to the ground portion and the electronic device; and the device is further provided in combination with a substrate having a conductive structure electrically coupling the first bonding portion to the second bonding portion.

18. The device of claim 14, wherein:

the elongated body portion comprises a folded structure to provide the integrated antenna comprises an integrated dipole antenna;

the first bonding portion and the second bonding portion are disposed immediately adjacent to each other along the edge of the packaged electronic device; and the device further comprises:
- a conductive feed structure electrically coupled to the first bonding portion and the electronic device; and
- a conductive ground structure electrically coupled to the second bonding portion and the electronic device.

19. The device of claim 14, wherein:

the elongated conductive body is configured as a u-shaped member with an open portion of the u-shaped member disposed facing opposite to the conductive die attach pad;

a first conductive lead is disposed within the open portion defined by the u-shaped member so that the elongated conductive body partially encloses the first conductive lead;

the device is further is provided in combination with a substrate having a first conductive structure and a second conductive structure;

the first conductive structure is electrically coupled to the first bonding portion and the first lead;

the second conductive structure is electrically coupled to the second bonding portion;

the device further comprises:
- a conductive feed structure electrically coupled to the first lead and the electronic device; and
- a conductive ground structure electrically coupled to the elongated body portion and the electronic device; and the conductive ground structure is electrically coupled to the elongated body portion at a location interposed between first bonding portion and the conductive feed structure in a top view.

20. A packaged electronic device having an integrated antenna comprising:

a lead frame comprising:
- a conductive die attach pad;
- conductive leads spaced apart from a first side of the conductive die attach pad; and
- an elongated conductive body configured as a u-shaped member with an open portion of the u-shaped member disposed facing opposite to the conductive die attach pad and having a first bonding portion disposed at a first end and second bonding portion disposed at an opposing second end, wherein a first conductive lead is disposed within the open portion defined by the u-shaped member so that the elongated conductive body partially encloses the first conductive lead;

a conductive probe feed structure electrically coupled to the first conductive lead and the conductive die attach pad;

a conductive shorting structure electrically coupled to the elongated conductive body and the conductive die attach pad;

a passive component electrically coupled between the conductive die attach pad and one of the elongated body portion and a second conductive lead;

an electronic device disposed adjacent the conductive die attach pad; and a package body encapsulating the electronic device, the conductive probe feed structure, the conductive shorting structure, the passive component, at least portions of the conductive die attach pad, at least portions of the conductive leads, and at least a portion of the elongated conductive body, wherein:

the integrated antenna comprises the conductive die attach pad, the at least one lead, the elongated conductive body, the conductive probe feed structure, and the conductive shorting structure.

* * * * *